(12) United States Patent
Lee et al.

(10) Patent No.: US 11,690,244 B2
(45) Date of Patent: Jun. 27, 2023

(54) DISPLAY DEVICE AND METHOD OF MANUFACTURING THE SAME

(71) Applicant: SAMSUNG DISPLAY CO., LTD., Yongin-si (KR)

(72) Inventors: Seungchang Lee, Yongin-si (KR); Gunhee Kim, Yongin-si (KR); Donghyun Kim, Yongin-si (KR); Sanghoon Kim, Yongin-si (KR); Soohyun Moon, Yongin-si (KR); Joohee Jeon, Yongin-si (KR); Sungjin Hong, Yongin-si (KR); Taehoon Yang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 184 days.

(21) Appl. No.: 16/856,716

(22) Filed: Apr. 23, 2020

(65) Prior Publication Data
US 2020/0381660 A1 Dec. 3, 2020

(30) Foreign Application Priority Data
May 27, 2019 (KR) .................... 10-2019-0062054

(51) Int. Cl.
| | |
|---|---|
| H10K 50/844 | (2023.01) |
| H10K 71/00 | (2023.01) |
| H10K 50/842 | (2023.01) |
| H01L 51/52 | (2006.01) |
| H01L 51/56 | (2006.01) |

(52) U.S. Cl.
CPC ...... H01L 51/5253 (2013.01); H01L 51/5246 (2013.01); H01L 51/56 (2013.01)

(58) Field of Classification Search
CPC ... H01L 51/5253–5256; H01L 51/5246; H01L 51/56
See application file for complete search history.

(56) References Cited

U.S. PATENT DOCUMENTS

| | | |
|---|---|---|
| 10,193,102 B2 | 1/2019 | Kanaya |
| 2008/0143247 A1* | 6/2008 | Kim .................. C03C 27/06 313/504 |

(Continued)

FOREIGN PATENT DOCUMENTS

| | | |
|---|---|---|
| CN | 109212800 | 1/2018 |
| JP | 2015-015232 | 1/2015 |

(Continued)

*Primary Examiner* — Shaun M Campbell
(74) *Attorney, Agent, or Firm* — F. Chau & Associates, LLC

(57) ABSTRACT

A display device is provided. The display device includes a substrate including a display area, an opening area disposed in the display area, a first non-display area at least partially surrounding the display area, and a second non-display area at least partially surrounding the opening area. A display layer is disposed in the display area. An encapsulating substrate covers the display layer and has an opening corresponding to the opening area. A sealing portion is disposed between the encapsulating substrate and the substrate. The sealing portion is disposed in the opening area and connects the encapsulating substrate to the substrate. A partition wall is disposed between the substrate and the sealing portion.

6 Claims, 24 Drawing Sheets

(56) References Cited

U.S. PATENT DOCUMENTS

| | | | |
|---|---|---|---|
| 2016/0172633 A1* | 6/2016 | Ahn | ............... H01L 51/524 |
| | | | 257/40 |
| 2016/0293883 A1* | 10/2016 | Hong | ............. H01L 51/5246 |
| 2018/0151834 A1* | 5/2018 | Kanaya | ............ H01L 51/504 |
| 2018/0233890 A1 | 8/2018 | Chida | |
| 2018/0366377 A1 | 12/2018 | Choi et al. | |
| 2618/0366536 | 12/2018 | Son et al. | |
| 2019/0081273 A1* | 3/2019 | Sung | ............. H01L 51/0097 |
| 2019/0205596 A1* | 7/2019 | Kim | ............... H01L 27/323 |

FOREIGN PATENT DOCUMENTS

| | | |
|---|---|---|
| JP | 2018-087863 | 6/2018 |
| KR | 10-1701368 | 1/2017 |

\* cited by examiner

DISPLAY DEVICE AND METHOD OF MANUFACTURING THE SAME

CROSS-REFERENCE TO RELATED APPLICATION

This application claims the benefit of and priority to Korean Patent Application No. 10-2019-0062054, filed on May 27, 2019, in the Korean intellectual Property Office, the present disclosure of which is incorporated by reference herein in its entirety.

TECHNICAL FIELD

The present disclosure relates to a display device, and more particularly, to a display device and a method of manufacturing the display device.

DISCUSSION OF THE RELATED ART

In recent years, physical buttons and the like have been removed from the front surface of various electronic devices that incorporate display devices, such as smartphones and the line. Additionally, display areas for displaying images have been enlarged so as to take up a high perportion of the front surface of the electronic devices. As smartphones, and other similar devices, often incorporate a front-facing camera proximate to the display, as the size of the display increases relative to the size of the front surface of the smartphone, there might not be sufficient non-display area on the front surface of the electronic devices to accommodate the front-facing camera and/or other elements. For example, a display device has been introduced into smartphones and other electronic devices in which a separate member for expanding the functionality of the display device, for example, a camera and/or various other elements, are arranged within a display area so as to enlarge the display area further.

In order to arrange a separate member, such as a camera, in the display area, a groove, notch, or other opening may be formed in the display area. The separate member may then be placed within the groove, notch, or other opening.

SUMMARY

A display device includes a substrate including a display area, an opening area disposed in the display area, a first non-display area surrounding at least a portion of the display area, and a second non-display area at least partially surrounding at least a portion of the opening area. A display layer is disposed in the display area. An encapsulating substrate covers the display layer and has an opening corresponding to the opening area. A sealing portion is disposed between the encapsulating substrate and the substrate, the sealing portion being disposed in the opening area and connecting the encapsulating substrate to the substrate. A partition wall is disposed between the substrate and the sealing portion.

The sealing portion may be in direct contact with at least a portion of the partition wall.

The partition wall may include an inorganic layer and/or an organic layer.

The sealing portion may be in contact with the organic layer of the partition wall.

An inner surface of the opening of the encapsulating substrate may protrude from an inside of the sealing portion to a center of the opening.

The substrate and the encapsulating substrate may respectively include alignment marks disposed at positions corresponding to each other.

A method of manufacturing a display device includes forming a display layer on a substrate. A sealing portion is arranged on the substrate. An encapsulating substrate is arranged to face the substrate, the encapsulating substrate including an opening corresponding to an opening area of the substrate. The substrate is coupled to the encapsulating substrate with by sealing portion. A cleaning liquid is supplied through the opening to remove a portion of the display layer inside the opening.

The cleaning liquid may remove an opposite electrode and/or an intermediate layer in the display layer.

The method may further include forming a partition wall in the opening area corresponding to the opening.

The partition wall may be arranged in correspondence with a position where the sealing portion is disposed.

An inner surface of the opening of the encapsulating substrate may protrude from the inside of the sealing portion to the center of the opening.

The opening of the encapsulating substrate may be formed by a laser or a drill.

The encapsulating substrate may include plastic and be formed by an extrusion process.

The method may further include aligning the substrate with the encapsulating substrate.

A method of manufacturing a display device includes forming an intermediate layer in both a display area and an opening area of a substrate and forming an opposite electrode on the substrate except for in the opening area. A sealing portion is arranged in the opening area. An encapsulating substrate is arranged to face the substrate. The encapsulating substrate includes an opening corresponding to the opening area. The substrate is coupled to the encapsulating substrate with the sealing portion. A cleaning liquid is supplied through the opening to remove the intermediate layer inside the opening.

The method may further include aligning the substrate with the encapsulating substrate.

The method may further include forming a partition wall on the substrate.

At least a portion of the sealing portion may be arranged on the partition wall.

The partition wall may include an inorganic layer and/or an organic layer.

The opening may be formed by a laser or a drill, or may be formed during extrusion molding of the encapsulating substrate.

BRIEF DESCRIPTION OF THE DRAWINGS

A more complete appreciation of the present disclosure and many of the attendant aspects thereof will become apparent and more readily appreciated from the following description of the embodiments, taken in conjunction with the accompanying drawings, in which.

DETAILED DESCRIPTION

Figure 1:
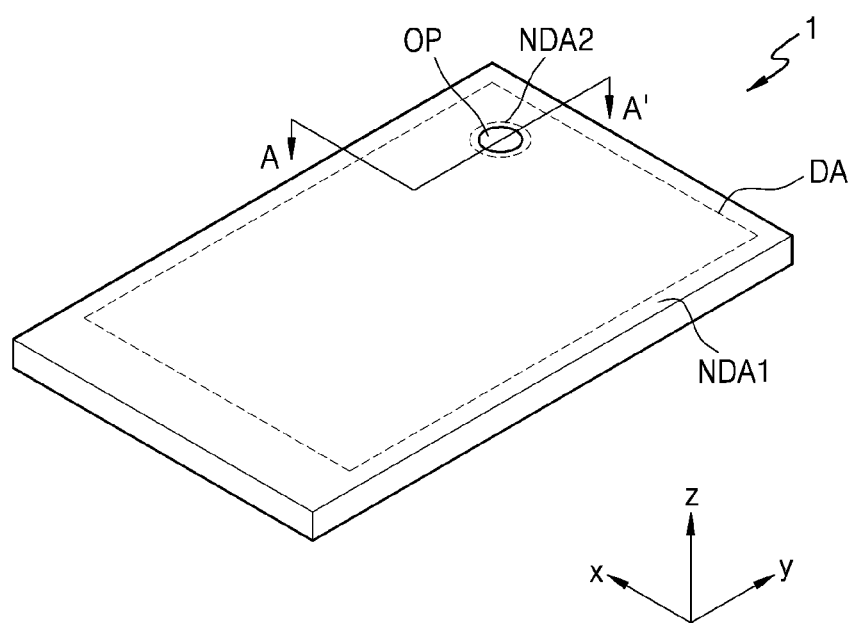
FIG. 1 is a perspective view illustrating a display device according to an exemplary embodiment of the present disclosure.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Like or corresponding reference numerals in the drawings and written description may denote like elements and to the extent that a description of an element has been omitted, it may be assumed that the omitted description is at least similar to the description of corresponding elements that are described elsewhere within the written description.

It will be understood that although the terms "first", "second", etc. may be used herein to describe various components, these components are not necessarily limited by these terms and these terms are used to distinguish one component from another.

It will be further understood that the terms "comprises," "includes," "comprising," and/or "including" used herein specify the presence of stated features or components, but do not preclude the presence or addition of one or more other features or components.

It will be understood that when a layer, region, or component is referred to as being "formed on," another layer, region, or component, it may be directly or indirectly formed on the other layer, region, or component. For example, intervening layers, regions, or components may be present.

Sizes of elements in the drawings may be exaggerated or reduced for convenience of description. While the relative sizes and angles of the elements illustrated in the figures may be taken as showing a particular embodiment of the present inventive concept, other embodiments are not necessarily limited to the relative sizes and angles shown.

In the following embodiments, the x-axis, the y-axis, and the z-axis are not limited to three axes of the rectangular coordinate system, and may be interpreted in a broader sense. For example, the x-axis, the y-axis, and the z-axis need not be perpendicular to one another.

The particular order of steps described and illustrated herein represents some, but not all embodiments of the present inventive concept and so other embodiments may perform similar or identical steps in different orders or at the same time.

FIG. 1 is a perspective view illustrating a display device 10 according to an exemplary embodiment of the present disclosure.

Referring to FIG. 1, the display device 1 may include a display area DA, an opening area OP, a first non-display area NDA1 and a second non-display area NDA2. The display device 1 may provide an image using light emitted from pixels arranged in the display area DA.

The opening area OP may be disposed in the display area DA. In this case, the fir non-display area NDA1 and the second non-display area NDA2 may be spaced apart from each other and the opening area OP may be entirely surrounded by the display area DA. The opening area OP may have various shapes. For example, the opening area OP may have a circular shape, a polygonal shape, an elliptical shape, or some combination of one or more of these shapes. Hereinafter, for convenience of description, the case where the opening area OP has a circular shape will be mainly described in detail. However, it is to be understood that the opening area OP may have any arbitrary shape.

The first non-display area NDA1 is an area in which pixels are not arranged, and the first non-display area NDA1 may surround the display area DA. The second non-display area NDA2 is also an area in which pixels are not arranged, and the second non-display area NDA2 may surround the opening area OP.

Hereinafter, an organic light-emitting display device will be described as at example of the display device 1 according to an exemplary embodiment of the present inventive concept, but the display device 1 is not limited thereto. For example, various types of display devices such as an inorganic electroluminescence (EL) display (e.g., inorganic light-emitting display) and a quantum dot light-emitting display may be used. In some embodiments, each pixel of the display device 1 may include an emission layer, and the emission layer may include an organic material, may include an inorganic material, may include a quantum dot, may include an organic material and a quantum dot, and/or may include an, inorganic material and a quantum dot.

Figure 2:
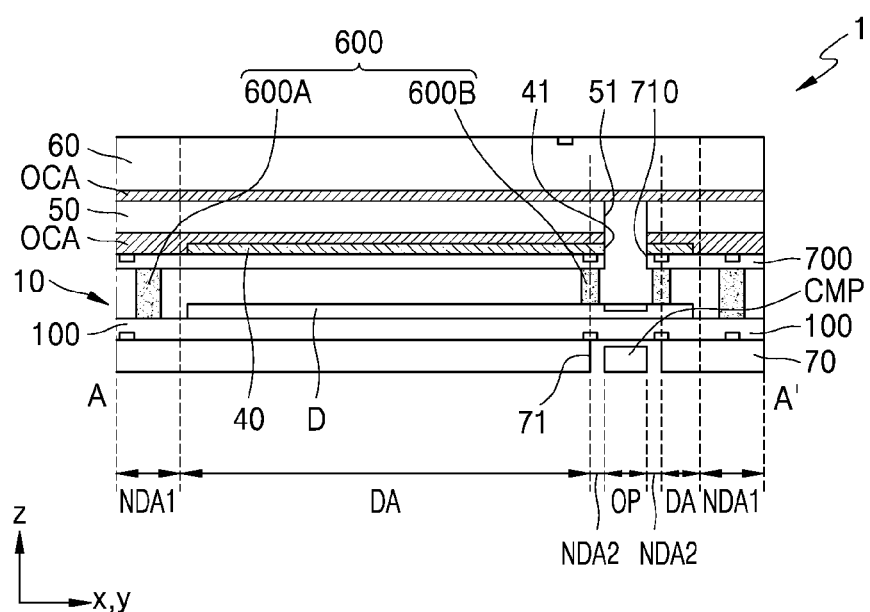
FIG. 2 is a cross-sectional view illustrating a display device according to an exemplary embodiment of the present disclosure.

FIG. 2 is a cross-sectional view illustrating a display device 1 according to an exemplar embodiment of the present disclosure.

Referring to FIG. 2, the display device 1 may include a display panel 10 and an input sensing member 40 such as a touch-sensor. The display panel 10 may display an image by using pixels arranged in a display area DA.

The display panel 10 may include a substrate 100, a display layer D, a sealing portion 600, and an encapsulating substrate 700. The sealing portion 600 may include a first sealing portion 600A disposed in the first non-display area NDA1 and a second sealing portion 600B disposed in the second non-display area NDA2. The first seating portion 600A may be disposed at the edges of the substrate 100 and the encapsulating substrate 700 to connect the substrate 100 to the encapsulating substrate 700. The second sealing portion 600B may be disposed in the opening area OP to completely surround the opening area OP. In this case, the second sealing portion 600B may be formed in a cylindrical shape having a space therein (e.g. a ring-shaped element) and may be disposed between the substrate 100 and the encapsulating substrate 700.

The input sensing member 40 may be disposed on the display panel 10. The input sensing member 40 may include an electrode disposed in the form of a pattern on the encapsulating substrate 700 of the display panel 10. The input sensing member 40 may receive a signal according to a touch operation when a user touches the display device 1 with a finger or implement, such as a stylus.

The display device 1 may further include an optical functional member 50 disposed on the input sensing member 40. The optical functional member 50 may reduce the reflectance of light (i.e., external light) incident from the outside toward the display panel 10 and/or may increase the color purity of light emitted from the display panel 10.

In an exemplary embodiment of the present disclosure, the optical functional member 50 may include a phase retarder and a polarizer. The phase retarder may be of a film type or a liquid crystal coating type, and may include a ($\lambda/2$) phase retarder and/or a ($\lambda/4$) phase retarder. The polarizer may also be of a film type or a liquid crystal coating type. The film type may include a stretchable synthetic resin film, and the liquid crystal coating type may include liquid crystals arranged in a predetermined arrangement. Each of the phase retarder and the polarizer may further include a protective film. The phase retarder and the polarizer itself or the protective film may be defined as a base layer of the optical functional member 50.

In an exemplary embodiment of the present disclosure, the optical functional member 50 may include a black matrix and/or color filters. The color filters may be arranged in consideration of the color of light emitted from each of the pixels of the display panel 10. Each of the color filters may include a red, green or blue pigment or dye. Alternatively, each of the color filters may further include quantum dots in addition to the pigment or dye described above. Alternatively, some of the color filters might not include the pigment or dye described above and may include scattering particles such as titanium oxide.

In an exemplary embodiment of the present disclosure, the optical functional member 50 may include a destructive interference structure. The destructive interference structure may include a first reflective layer and a second reflective layer disposed on different layers. First reflected light and second reflected light reflected from the first reflective layer and the second reflective layer, respectively, may destructively interfere, and thus, external light reflectance may be reduced.

The process of forming the optical functional member 50 may be performed separately from the process of forming the input sensing member 40, and in this case, an adhesive film such as an optical transparent adhesive member (OCA) may be disposed between the optical functional member 50 and the input sensing member 40, as shown in FIG. 2. In an exemplary embodiment of the present disclosure, the process of forming the optical functional member 50 may be continuously performed after the process of forming the input sensing member 40, and in this case, an adhesive film might not be disposed between the optical functional member 50 and the input sensing member 40.

The display device 1 may further include a protective member 60 disposed on the optical functional member 50. The protective member 60 may include glass. According to an exemplary embodiment of the present disclosure, the protective member 60 may include a coating layer disposed on the glass. According to an exemplary embodiment of the present disclosure, the protective member 60 may include a plastic material. The protective member 60 may include a plurality of layers other than a single layer.

The display device 1 may include a cover member 70 disposed on a lower surface of the display panel 10. The cover member 70 may be in various forms. For example, the cover member 70 may include a film adhered to the substrate 100 of the display panel 10. According to an exemplary embodiment of the present disclosure, the cover member 70 may include a case in which the substrate 100 of the display panel 10 is seated. In this case, the cover member 70 may be supported by arranging a component CMP.

The opening area OP of the display device 1 may be a component area in which the component CMP for adding various functions to the display device 1 is disposed. The component CMP may include one or more electronic elements. For example, the component CMP may include an electronic element that uses (e.g. generates and/or senses) light or sound. For example, the electronic element may include a sensor (e.g., an infrared sensor) that outputs and/or receives light, a camera that captures an image by receiving light, a sensor that outputs and senses light or sound to measure distance or recognize fingerprints, a small lamp or flash that outputs light, a speaker that outputs sound, or the like. The electronic element using light may use light of a specific wavelength band, for example, visible light, infrared light, and ultraviolet light. In some embodiments, the opening area OP may be understood as a transmission area through which light or/and sound, which is output from the component CMP to the outside or travels from the outside toward the electronic element, may pass.

When the display device 1 provides specific information, like in a smart watch or a car dashboard, the component CMP may be an element such as a needle, hand, or dial indicating certain information (e.g., vehicle speed, amount of fuel, and time, such as clock hands). Alternatively, the component CMP may include a component such as a lamp or accessories that increase the aesthetic sensibility of the display device 1.

The display panel 10, the input sensing member 40, and the optical functional member 50, as described above, may include openings corresponding to the opening area OP. In this case, an opening of the display panel 10, an opening 41 of the input sensing member 40, and an opening 51 of the optical functional member 50 may be disposed in the opening area OP and may all overlap each other so as to form a continuous opening. The opening of the display panel 10 may be in the form of a groove, and the opening 41 of the input sensing member 40 and the opening 51 of the optical functional member 50 may be in the form of a hole.

Figure 3:
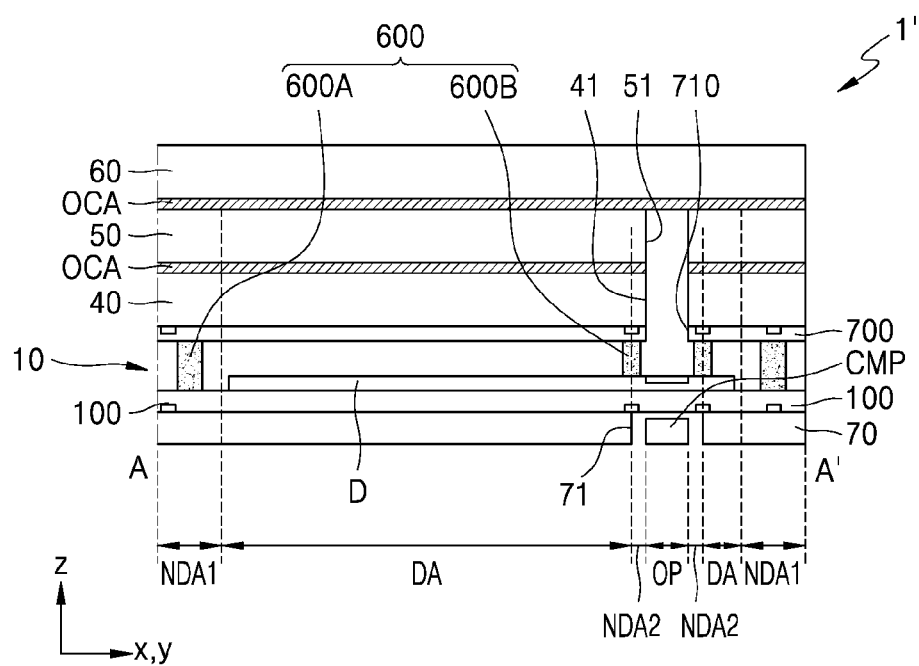
FIG. 3 is a cross-sectional view illustrating a display device according to an exemplary embodiment of the present disclosure.

FIG. 3 is a cross-sectional view illustrating a display device 1' according to an exemplary embodiment of the present disclosure. In FIG. 3, the same reference numerals as used in FIG. 2 may denote the same or similar members as those in FIG. 2.

Referring to FIG. 3, the display device 1' may include a display panel 10 and an input sensing member 40. The display panel 10 may display an image by using pixels arranged in a display area DA.

The input sensing member 40 acquires coordinate information according to an external input, for example, a touch event. The input sensing member 40 may include a sensing electrode (or touch electrode) and a trace line (or signal wiring) connected to the sensing electrode. The input sensing member 40 may be disposed on the display panel 10.

A resin layer, for example, an optically clean resin (OCR) layer, may be disposed between the display panel 10 and the input sensing member 40. The resin layer is distinguished from a film-type adhesive having a constant thickness. The resin layer may include a photo-curable resin, for example, an ultraviolet (UV)-curable resin. The resin layer may include an acrylic resin, for example, an acrylic ester-based material.

The display panel 10, the input sensing member 40, and an optical functional member 50 may each include openings. In this case, an opening of the display panel 10, an opening 41 of the input sensing member 40, and an opening 51 of the optical functional member 50 may all be disposed in an opening area OP and may overlap each other so as to form a single continuous opening. The opening of the display panel 10, the opening 41 of the input sensing member 40 and the opening 51 of the optical functional member 50 may be in the form of a hole.

According to an exemplary embodiment of the present disclosure, the optical functional member 50 may be disposed on the display panel 10 and the input sensing member 40 may be disposed on the optical functional member 50. Also, a protective member 60 may be disposed on the input sensing member 40.

Figure 4:
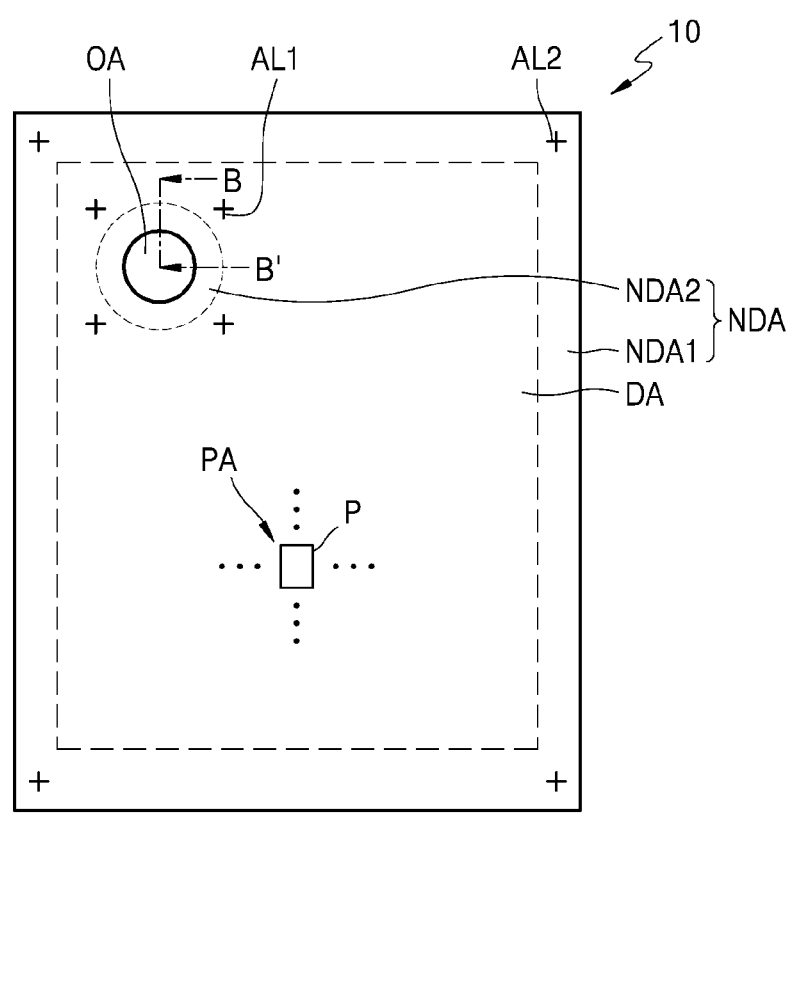
FIG. 4 is a plan view illustrating a display panel according to an exemplary embodiment of the present disclosure.

FIG. 4 is a plan view illustrating a display panel 10 according to an exemplary embodiment of the present disclosure.

Referring to FIG. 4, the display panel 10 may include a display area DA, an opening area OA, a first non-display area NDA1, and a second non-display area NDA2, with the first non-display area NDA1 and the second non-display area NDA2 together comprising the non-display area NDA.

At least one pixel P may be arranged in the display area DA. A plurality of pixels P may be provided and the plurality of pixels P may implement different colors. For example, each of the pixels P may implement red, green, and/or blue. According to an exemplary embodiment of the present disclosure, each of the pixels P may implement red, yellow, and/or blue. Colors implemented by the pixels P are not limited exclusively to those described above and may include various colors.

In addition to the above case, the pixel P may also implement white light. In this case, the display panel 10 may include a separate color filter.

An opening of the display panel 10 may be disposed in an opening area OP. The opening may be formed in a groove shape in the display panel 10. The opening may be in a state in which some of the layers or members of the display panel 10 have been removed. The opening area OP may transmit light.

The display panel 10 may include a driving unit such as a scan driver and a data driver liar transmitting predetermined signals to each pixel P of the display area DA. The driving unit may be disposed in the first non-display area NDA1 and the second non-display area NDA2. In addition, pads connected to the driving unit and connected to an external circuit board or the like may be disposed in the second non-display area NDA2.

Figure 5:
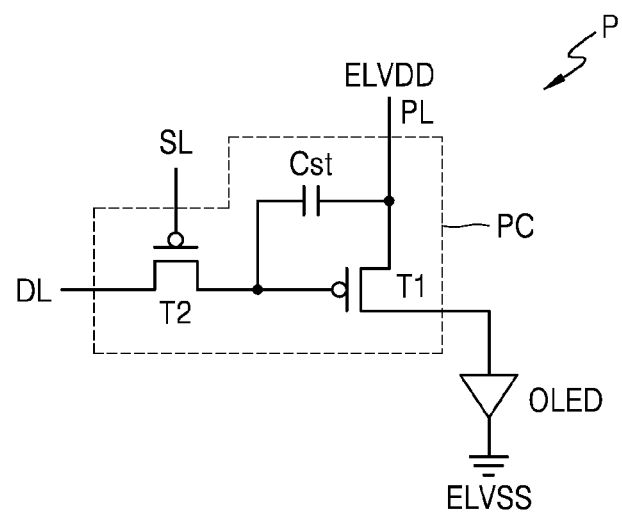
FIG. 5 is an equivalent circuit diagram of a pixel of a display panel according to an exemplary embodiment of the present disclosure.

FIG. 5 is an equivalent circuit diagram of a pixel P of a display panel according to an exemplary embodiment of the present disclosure.

Referring to FIG. 5, the pixel P may include a pixel circuit PC and a display element connected to the pixel circuit PC, for example, an organic light-emitting diode OLED. The pixel circuit PC may include a first thin film transistor T1, a second thin film transistor T2, and a storage capacitor Cst. The pixel P may emit, for example, red, green, blue, or white light through the organic light-emitting diode OLED.

The second thin film transistor T2 is a switching thin film transistor and is connected to a scan line SL and a data line DL, and may transfer a data voltage input from the data line DL to the first thin film transistor T1 based on a switching voltage input from the scan line SL. The storage capacitor Cst may be connected to the second thin film transistor T2 and a driving voltage line PL and may store a voltage corresponding to a difference between a voltage transferred from the second thin film transistor T2 and a first power voltage ELVDD supplied to the driving voltage line PL.

The first thin film transistor T1 is a driving thin film transistor and ma be connected to the driving voltage line PL and the storage capacitor Cst and may control a driving current flowing through the organic light-emitting diode OLED from the driving voltage line PL in response to the voltage value stored in the storage capacitor Cst. The organic light-emitting diode OLED may emit light having predetermined brightness by using; the driving current. An opposite electrode (e.g. a cathode) of the organic light-emitting diode OLED may receive a second power voltage ELVSS.

FIG. 5 illustrates that the pixel circuit PC includes two thin film transistors and one storage capacitor, but the present disclosure is not limited exclusively thereto. The number of thin film transistors and the number of storage capacitors may be variously changed according to the design of the pixel circuit PC. For example, the pixel circuit PC may further include four or more thin film transistors in addition to the above-mentioned two thin film transistors.

Figure 6:
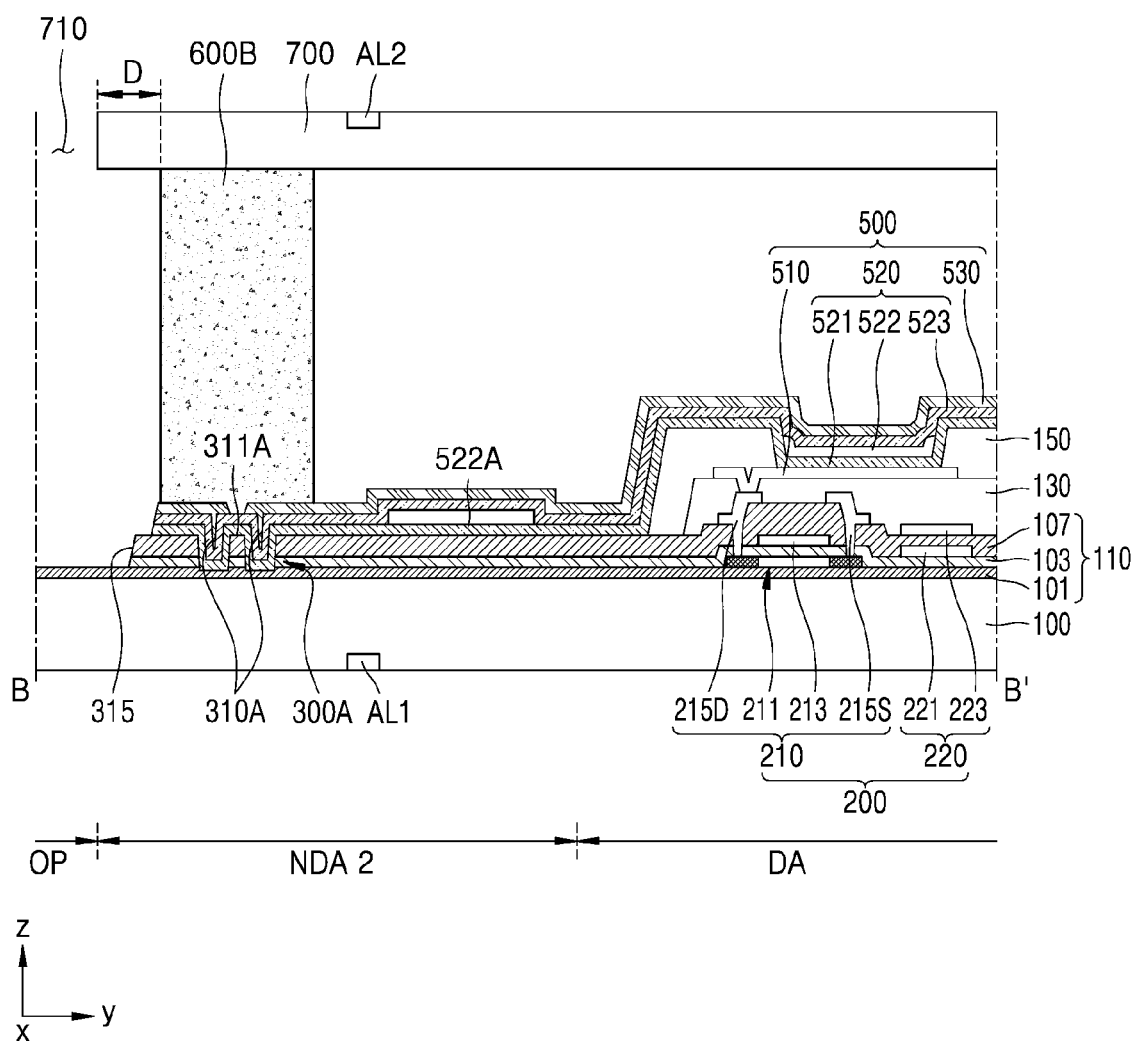
FIG. 6 is a cross-sectional view illustrating an example of a cross section taken along line B-Be in FIG. 4.

FIG. 6 is a cross-sectional view illustrating an example of a cross section taken along a line B-B' in FIG. 4.

Referring to FIGS. 4 and 6, the display panel 10 includes a substrate 100, a pixel array PA, a sealing portion 600B, and an encapsulating substrate 700.

The substrate 100 may include glass or polymer resin. The polymer resin may include polyethersulphone, polyacrylate, polyarylate, polyetherimide, polyethylene naphthalate, polyethylene terephthalate, polyphenylene sulfide, polyimide, polycarbonate, and/or cellulose acetate propionate. The substrate 100 may have a multi-layered structure including a layer including the aforementioned polymer resin and an inorganic layer. Hereinafter, for convenience of description, the case where the substrate 100 includes glass will be mainly described in detail.

A through hole 710 is disposed in the display area DA of the substrate 100. The through hole 710 is a hole passing through the encapsulating substrate 700 and is surrounded by the pixel array PA disposed in the display area DA and including a plurality of pixels P.

Each pixel P of the pixel array PA includes a pixel circuit and a light-emitting element electrically connected to the pixel circuit, for example, an organic light-emitting diode, and provides an image via light emitted from the light-emitting element.

The sealing portion 600B may be disposed between the substrate 100 and the encapsulating substrate 700. The encapsulating substrate 700 may face the substrate 100. In this case, the encapsulating substrate 700 may include a material that is the same as or similar to that of the substrate 100. The encapsulating substrate 700 may include glass and/or plastic. The encapsulating substrate 700 may include at least one layer including at least one resin.

The encapsulating substrate 700 may be formed to include the through hole 710 or the through hole 710 may be made after the encapsulation substrate 700 has been made, for example, by drilling, laser, or the like.

The inner surface of the through hole 710 of the encapsulating substrate 700 may protrude from the inner surface of the sealing portion 600B toward the center of the through hole 710. For example, a distance D from the inner surface of the sealing portion 600B to the inner surface of the through hole 710 of the encapsulating substrate 700 may be in the range of 100 μm to 2000 μm.

The through hole 710 is surrounded by the pixels P, and an area where a pixel p is not provided, for example, a second non-display area NDA2, is disposed between the through hole 710 and the pixels P. In this case, a pattern portion 300A is disposed in the second non-display area NDA2.

The pattern portion 300A includes a recess 310A and/or a cladding layer covering the recess 310A. Hereinafter, for convenience of description, the case where the pattern portion 300A includes the recess 310A will be mainly described in detail.

The recess 310A may be a kind of groove formed in the thickness direction of an insulating layer 110 disposed on the substrate 100.

The insulating layer 110 haying the recess 310A is an inorganic layer and may include a single inorganic layer or a plurality of inorganic layers. For example, the insulating layer 110 may include an inorganic material such as silicon oxide, silicon nitride, silicon oxynitride, and/or the like.

An auxiliary recess 315 may be disposed between the through hole 710 and the pattern portion 300A. The auxiliary recess 315 may be connected to the through hole 710 spatially as a space concavely formed at the end of the insulating layer 110 adjacent to the through hole 710.

A pixel circuit 200 and a light-emitting element 500 are disposed in the display area DA. The pixel circuit 200 and the light-emitting element 500 may form a display layer.

The light-emitting element 500 includes a pixel electrode 510 electrically connected to the pixel circuit 200 with a via insulating layer 130 disposed therebetween, an opposite electrode 530 facing the pixel electrode 510, and an intermediate layer 520 disposed between the pixel electrode 510 and the opposite electrode 530, and the via insulating layer 130 has a via hole. In an exemplary embodiment of the present disclosure, the via insulating layer 130 may include an insulating organic material.

The pixel electrode 510 may be exposed through an opening provided in a pixel-defining layer 150 and the edge of the pixel, electrode 510 may be covered with the pixel-defining layer 150 including an insulating organic material. In an exemplary embodiment of the present disclosure, the pixel electrode 510 may include silver (Ag), magnesium (Mg), aluminum (Al), platinum (Pt), palladium (Pd), gold (Au), nickel (Ni), neodymium (Nd), iridium (Ir), chromium (Cr), or a compound thereof.

The opposite electrode 530 may be integrally formed to entirely cover the display area DA. In an exemplary embodiment of the present disclosure, the opposite electrode 530 may include a thin metal layer containing Ag and/or Mg, or a transparent conductive oxide (TCO) layer including indium tin oxide (ITO), indium zinc oxide (IZO), zinc oxide (ZnO), indium oxide ($In_2O_3$), indium gallium oxide (ITO), and/or aluminum zinc oxide (AZO).

The intermediate layer 520 includes an emission layer 522. The emission layer 522 may include an organic material including a fluorescent or phosphorescent material that emits light of one of red, green, and blue, and may be patterned corresponding to the pixel P in the display area DA.

The emission layer 522 may be patterned such that patterns thereof are spaced apart from each other over the entire region of the substrate 100. In this case, the emission layer 522 may correspond to the pixel P, as described above, and may be disposed in the second non-display area NDA2 or the opening area OP. For example, the emission layer 522 may include a first dummy emission layer 522A disposed in the second non-display area NDA2 and a second dummy emission layer disposed in the opening area OP. Although only one first dummy emission layer 522A is shown in FIG. 6, the present disclosure is not limited thereto and one or more first dummy emission layers 522A and one or more second dummy emission layers may be provided. For example, when a plurality of first dummy emission layers 522A and a plurality of second dummy emission layers are provided, the plurality of first dummy emission layers 522A may be spaced apart from each other in the second non-display area NDA2 and the plurality of second dummy emission layers may be spaced apart from each other in the opening area OP. According to an exemplary embodiment of the present disclosure, the first dummy emission layer 522A and the second dummy emission layer might not be formed when the emission layer 522 is formed.

The intermediate layer 520 may include a first functional layer 521 disposed between the emission layer 522 and the pixel electrode 510 and/or a second functional layer 523 disposed between the emission layer 522 and the opposite electrode 530.

The first functional layer 521 may include a hole injection layer (HIL) and/or a hole transport layer (HTL). The HIL allows holes to be easily emitted from an anode, and the HTL allows the holes of the HIL to be transmitted to the emission layer 522.

The HIL may include a phthalocyanine compound such as copper phthalocyanine, DNTPD(N,N'-diphenyl-N,N'-bis-[4-(phenyl-m-tolyl-amino)-phenyl]-biphenyl-4,4'-diamine), m-MTDATA(4,4',4"-tris(3-methylphenylphenylamino) triphenylamine), TDATA(4,4',4"-Tris(N,N-diphenylamino)triphenylamine), 2T-NATA(4,4',4"-tris{N,-(2-naphthyl)-N-phenylamino}-triphenylamine), PEDOT/PSS(Poly(3,4-ethylenedioxythiophene)/Poly(4-styrenesulfonate)), Pani/DBSA(Polyaniline/Dodecylbenzenesulfonic acid), Pani/CSA(Polyaniline/Camphor sulfonicacid), or PANI/PSS (Polyaniline)Poly(4-styrenesulfonate), but it is not limited thereto.

The HTL may include a carbazole derivative such as N-phenylcarbazole or polyvinylcarbazole, TPD(N,N'-bis(3-methylphenyl)-N,N-diphenyl-[1,1-biphenyl]-4,4'-diamine), NPB(N,N'-di(1-naphthyl)-N,N'-diphenylbenzidine), or a triphenylamine-based material such as TCTA(4,4',4"-tris(N-carbazolyl)triphenylamine), but it is not limited thereto.

The second functional layer 523 may include an electron transport layer (ETL) and/or an electron injection layer (EIL). The EIL allows electrons to be easily emitted from a cathode, and the ETL allows the electrons of the EIL to be transmitted to the emission layer 522.

The ETL may include Alq3, BCP(2,9-Dimethyl-4,7-diphenyl-1,10-phenanthroline), Bphen(4,7-Diphenyl-1,10-phenanthroline), TAZ(3-(4-Biphenylyl)-4-phenyl-5-tert-butylphenyl-1,2,4-triazole), NTAZ(4-(Naphthalen-1-yl)-3,5-diphenyl-4H-1,2,4-triazole), tBu-PBD(2-(4-Biphenylyl)-5-(4-tert-butylphenyl)-1,3,4-oxadiazole), BAlq(Bis(2-methyl-8-quinolinolato-N1,O8)-(1,1'-Biphenyl-4-olato) aluminum), Bebq2(beryllium bis(benzoquinolin-10-olate)), or ADN(9,10-di(naphthalene-2-yl)anthrascene, but it is not limited thereto.

The EIL may include a material such as LiF, NaCl, CsF, $Li_2O$, BaO, or Liq, but it is not limited thereto.

The first functional layer 521 and the second functional layer 523 might not be present in the opening area OP. The first and second functional layers 521 and 523 may be formed to cover not only the display area DA but also the second non-display area NDA2 surrounding the through hole 710 during the manufacturing process of the display device 1, and then an area corresponding to the opening area OP may be removed. According to an exemplary embodiment of the present disclosure, the first functional layer 521 and the second functional layer 523 may be patterned together with the emission layer 522, and thus, patterns of the first functional layer 521 may be spaced apart from each other and patterns of the second functional layer 521 may be spaced apart from each other. In this case, the first functional layer 521, the emission layer 522, and the second functional layer 523 may be stacked to form intermediate layers 520, and the intermediate layers 520 may be spaced apart from each other. According to an exemplary embodiment of the present disclosure, the emission layer 522 may be formed by patterning in the same manner as described above, and the first functional layer 521 and the second functional layer 523 may be formed exclusively in the display area DA. Hereinafter, for convenience of description, the case where the first functional layer 521 and the second functional layer 523 are formed over the entire surface of the substrate 100 and then an area corresponding to the opening area OP is removed will be mainly described in detail.

The pixel circuit 200 includes a thin film transistor 210 and a storage capacitor 220. The insulating, layer 110 may include a buffer layer 101, a gate insulating layer 103, and an interlayer insulating layer 107 sequentially disposed on the substrate 100.

The buffer layer 101 is disposed on the substrate 100 to prevent the permeation of impurities, the gate insulating layer 103 is disposed between a semiconductor layer 211 and a gate electrode 213 of the thin film transistor 210, and the interlayer insulating layer 107 is disposed between the gate electrode 213 of the thin film transistor 210 and the source electrode 215S and the drain electrode 215D of the thin film transistor 210.

Each of the buffer layer 101, the gate insulating layer 103, and the interlayer insulating layer 107 include an insulating inorganic material. For example, each of the buffer layer 101, the gate insulating layer 103, and the interlayer insulating layer 107 may include silicon nitride, silicon oxide, and/or silicon oxynitride.

The recess 310A of the pattern portion 300A is concavely formed along the thickness direction of the insulating layer 110. The recess 310A may be formed by etching the interlayer insulating layer 107, and the fine insulating layer 103 until a portion of the buffer layer 101 is exposed therethrough. An etch process for forming the recess 310A may be a dry etching process and may be performed together in a process of forming a contact hole for connecting the semiconductor layer 211 of the thin film transistor 210 to each of the source electrode 215S and the drain electrode 215D.

The thin film transistor 210 and the storage capacitor 220 of the pixel circuit 200 may be disposed at different positions.

The insulating layer 110 may include the, buffer layer 101, the gate insulating layer 103, and the interlayer insulating layer 107 which are sequentially disposed on the substrate 100, depending on the structure of the pixel circuit 200. The interlayer insulating layer 107 may be disposed between the lower electrode 221 and the upper electrode 223 of the storage capacitor 220 to function as a dielectric.

Although FIG. 6 illustrates the case where the thin film transistor 210 of the pixel circuit 200 is of a top gate type, the present disclosure is not limited thereto. According to an exemplary embodiment of the present disclosure, the thin film transistor 210 may be of a bottom gate type. In addition, although FIG. 6 illustrates the case where the lower electrode 221 of the storage capacitor 220 is disposed on the same layer as the gate electrode 213 so that the lower electrode 221 and the gate electrode 213 include the same material, and the upper electrode 223 of the storage capacitor 220 is disposed on the same layer as the source electrode 215S and the drain electrode 215D so that the upper electrode 223, the source electrode 215S, and the drain electrode 215D include the same material, the present disclosure is not limited thereto. In addition, although FIG. 6 illustrates the case where the thin film transistor 210 and the storage capacitor 220 do not overlap each other and the gate electrode 213 of the thin film transistor 210 corresponds to the lower electrode 221 of the storage capacitor 220, the present disclosure is not limited thereto.

Figure 7:
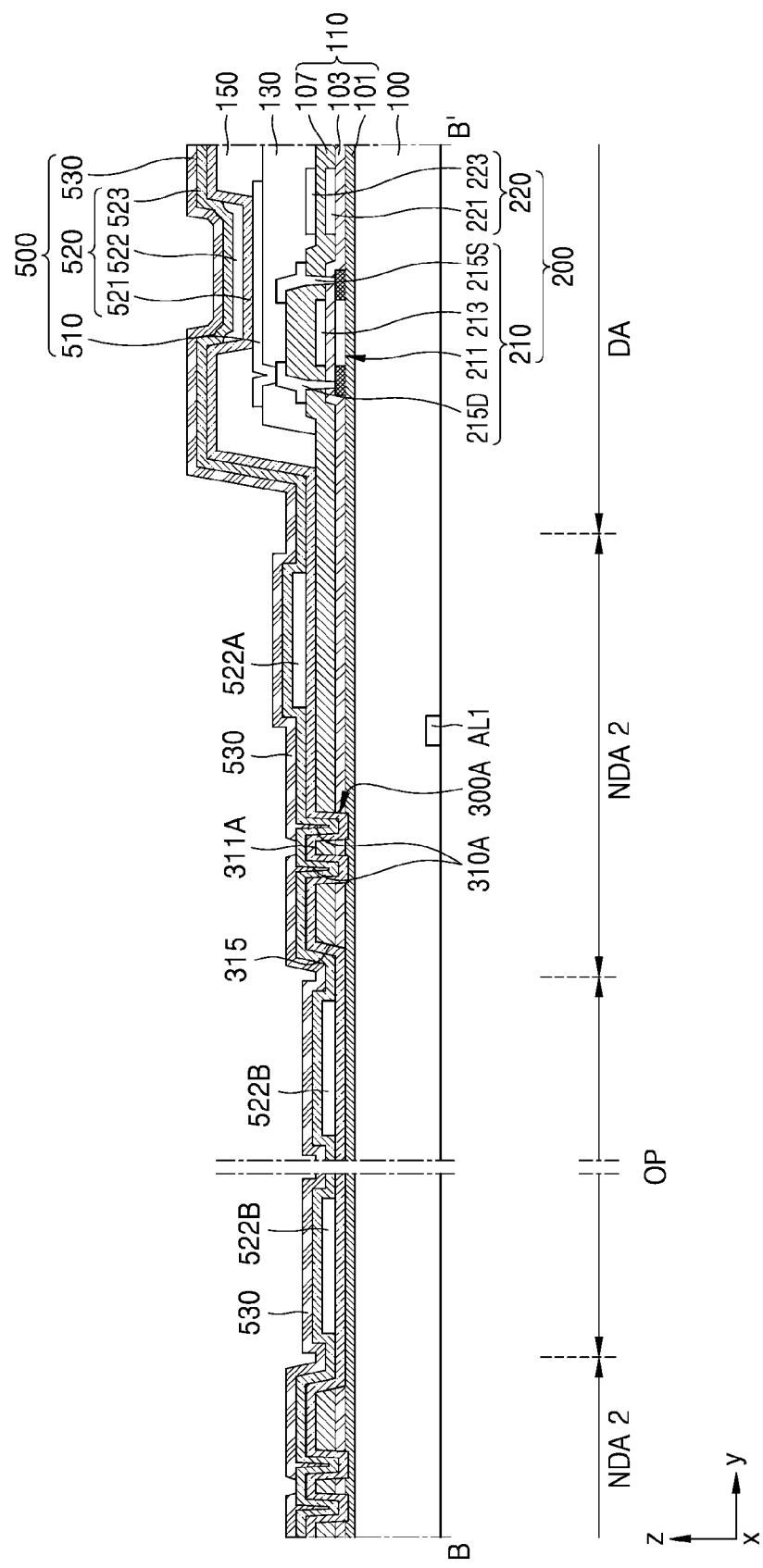
FIGS. 7 to 9 are cross-sectional views illustrating a method of manufacturing the display panel shown in FIG. 6.
Figure 8:
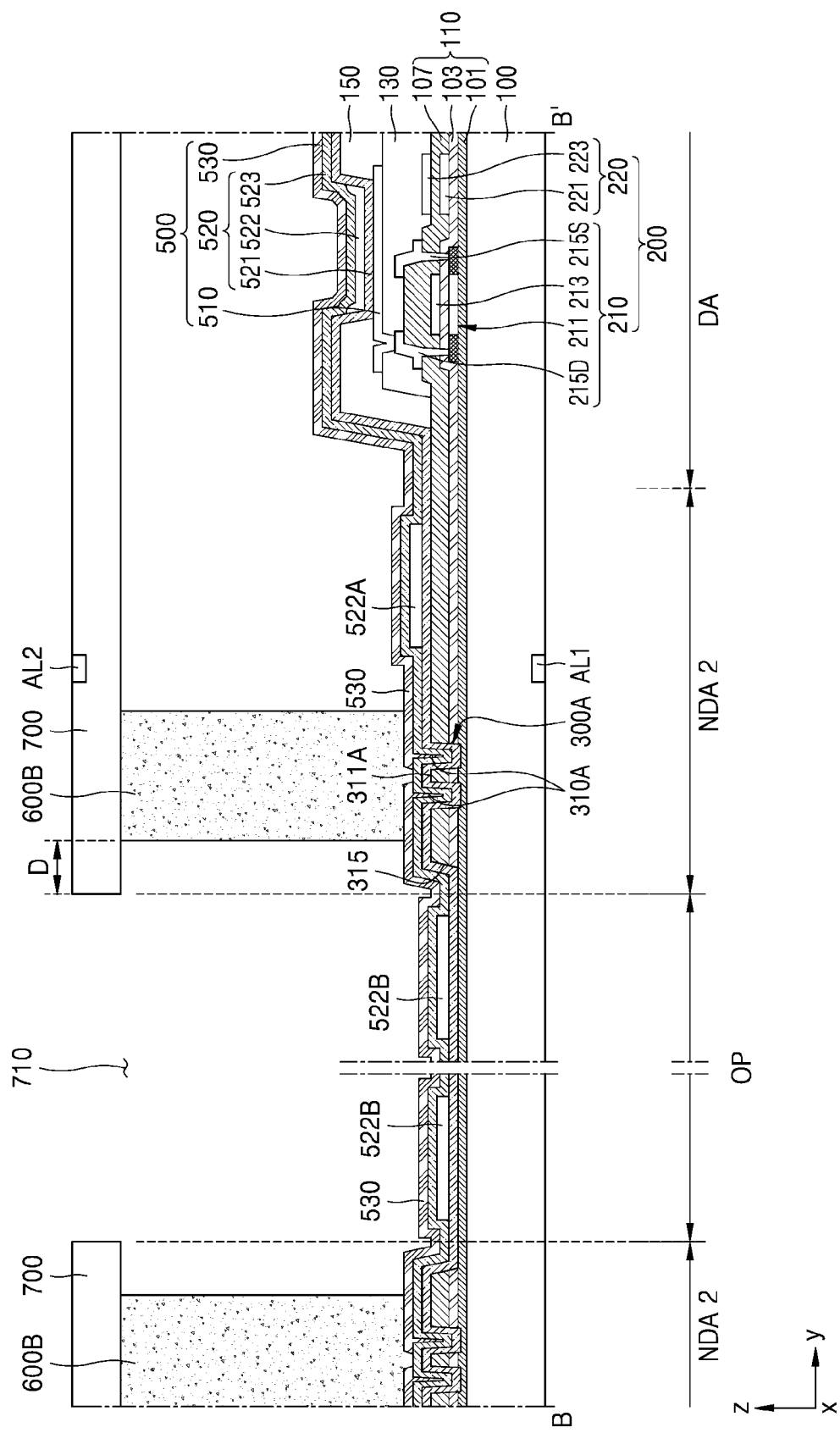
Figure 9:
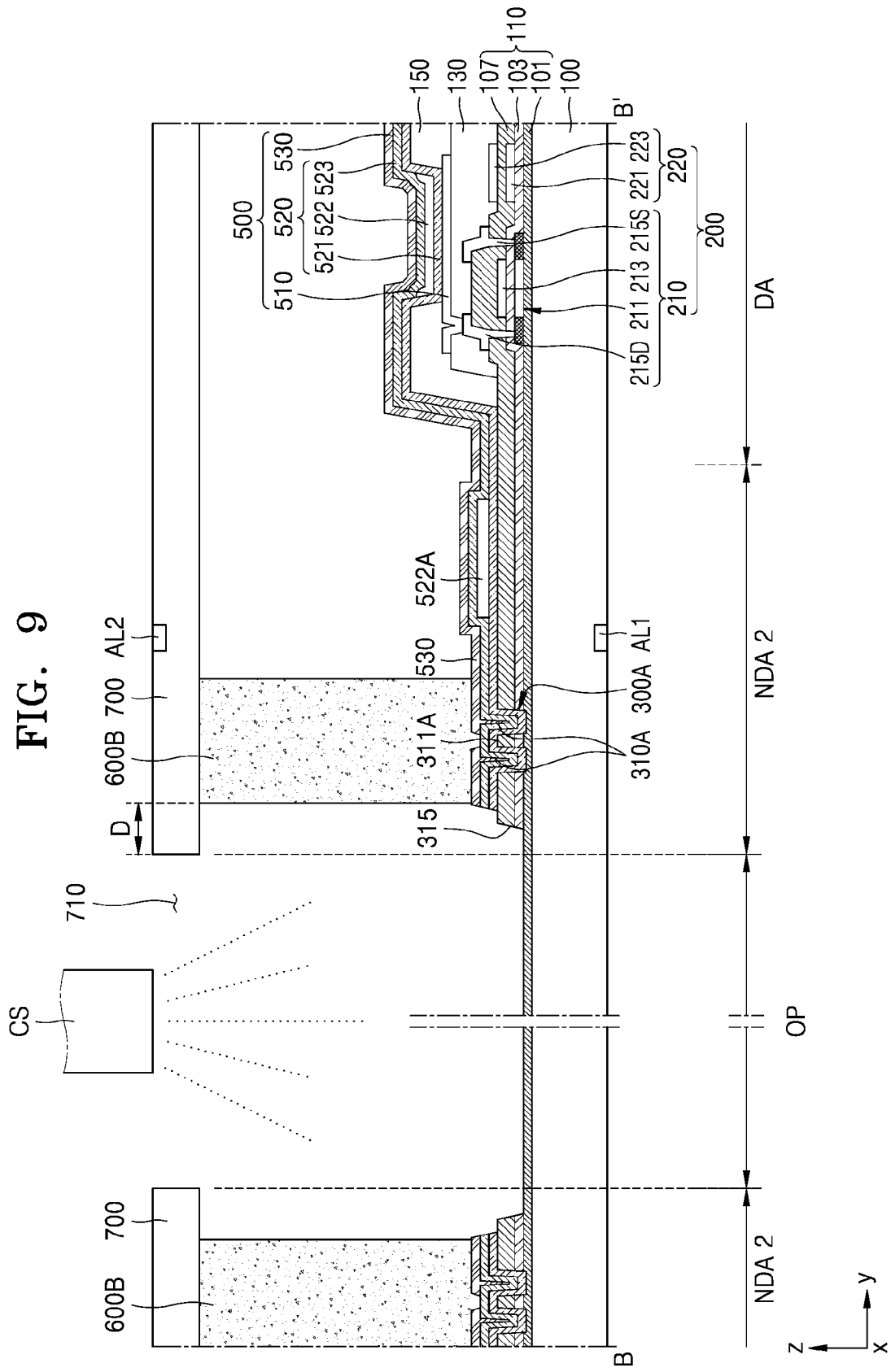

FIGS. 7 to 9 are cross-sectional views illustrating a method of manufacturing the display panel 10 shown in FIG. 6.

Referring to FIGS. 7 to 9, the pixel circuit 200 and the light-emitting element 500 may be formed on the substrate 100 when the display panel 10 as described above is manufactured. In this case, the recess 310A may be formed while the pixel circuit 200 is formed.

In the case of fabricating the light-emitting element 500, the intermediate layer 520 and the opposite electrode 530 may be formed over the entire surface of the substrate 100. For example, the first functional layer 521, the second functional layer 523, and the opposite electrode 530 may be disposed over the entire surface of the substrate 100, and a plurality of emission layers 522 may be spaced apart from each other over the entire surface of the substrate 100 and have a uniform pattern.

In this case, the intermediate layers 520 and/or the opposite electrode 530 may he disposed in the opening area OP and the second non-display area NDA2. For example, the first functional layer 521, the second functional layer 523, and/or the first dummy emission layer 522A may be disposed in the second non-display area NDA2. Also, the first functional layer 521, the second functional layer 523, and/or a second dummy emission layer 522B may be disposed in the opening area OP. At least one first dummy emission layer 522A may be formed in the second non-display area NDA2 and a plurality of emission layers 522 may be disposed to be spaced apart from each other in the second non-display area NDA2. In addition, at least one second dummy emission layer 522B may be formed in the opening area OP, and a plurality of second dummy emission layers 522B may be spaced apart from each other in the opening area OP.

Hereinafter, for convenience of description, the case where a first functional layer 521 at least one first dummy emission layer 522A, a second functional layer 522A, and an opposite electrode 530 are formed in the second non-display area NDA2 and the opening area OP will be mainly described in detail.

The insulating layer 110 might not be disposed con the substrate 100 in a portion of the second non-display area NDA2. After the insulating layer 110 is formed on the substrate 100, the insulating layer 110 may be removed when the recess 310A is formed, as described above. According to an exemplary embodiment of the present disclosure, the insulating layer 110 might not be formed in the second non-display area NDA2. According to an exemplary embodiment of the present disclosure, the insulating layer 110 may be formed in the second non-display area NDA2 and then might not be removed from the second non-display area NDA2. Hereinafter, for convenience of description, the case where the insulating layer 110 is formed in the second non-display area NDA2 and then disposed in the second non-display area NDA2 will be mainly described in detail.

The sealing portion 600 may be disposed on the recess 310A, and the position of the substrate 100 and the position of the encapsulating substrate 700 may be aligned. For example, an alignment mark may be formed in each of the encapsulating substrate 700 and the substrate 100. For example, a first alignment mark AL1 may be formed in the substrate 100, and a second alignment mark AL2 may be formed in the encapsulating substrate 700. Each of the first alignment mark AL1 and the second alignment mark AL2 may have a particular shape such as a cross shape. In this case, the first alignment mark AL1 and the second alignment mark AL2 may be disposed at various positions of the substrate 100 and the encapsulating substrate 700, respectively. For example, the first alignment mark AL1 and the second alignment mark AL2 may be disposed in an edge portion of the substrate 100 and an edge portion of the encapsulating substrate 700, respectively, and disposed in the second non-display area NDA2. A plurality of first alignment marks AL1 and a plurality of second alignment marks AL2 may be provided. In this case, each of the first alignment marks AL1 and each of the second alignment marks AL2 may be disposed at positions corresponding to each other when the substrate 100 and the encapsulating substrate 700 are arranged to overlap each other. Hereinafter, for convenience of description, the case where the first alignment mark AL1 and the second alignment mark AL2 are disposed in the second non-display area NDA2 of the substrate 100 and the second non-display area NDA2 of the encapsulating substrate 700, respectively will be mainly described in detail. When the positions of the substrate 100 and the encapsulating substrate 700 are aligned, the first alignment mark AL1 and the second alignment mark AL2 may be aligned with each other. For example, the first alignment mark AL1 and the second alignment mark AL2 may be photographed through a vision unit such as a separately provided camera or the like to determine relative positions of the substrate 100 and the encapsulating substrate 700, and then the position of the substrate 100 and/or the encapsulating substrate 700 may be varied to thereby align the substrate 100 and the encapsulating substrate 700.

After the position of the substrate 100 and the position of the encapsulating substrate 700 are aligned with each other, the encapsulating substrate 700 may be placed on the sealing portion 600. The sealing portion 600 may be cured by providing energy to the sealing portion 600. In this case, the encapsulating substrate 700 may be in a state, in which the through hole 710 has been formed, before being placed on the sealing portion 600. For example, when the encapsulating substrate 700 includes glass, the through hole 710 may be formed in the encapsulating substrate 700 through a drill, a laser, or the like after the encapsulating substrate 700 is manufactured. According to an exemplary embodiment of the present disclosure, when the encapsulating substrate 700 includes plastic, the encapsulating substrate 700 may be formed through extrusion molding, and in this case, the encapsulating substrate 700 may be manufactured with the through hole 710 formed therein. The encapsulating substrate 700 having the through hole 710 is not limited to the above-described process, and the present disclosure includes all the cases in which the through hole 710 is formed when the encapsulating substrate 700 is manufactured or after the encapsulating substrate 700 is manufactured.

As described above, when the recess 310A is provided, moisture or oxygen may be prevented by the recess 310A from moving toward the light-emitting element 500. In addition, a portion of the sealing portion 600 may be inserted into the recess 310A to increase a contact area between an uneven portion including the recess 310A and the sealing portion 600, and thus, the sealing portion 600 may be firmly fixed. The opposite electrode 530 might not be partially formed in a part of a portion 311A disposed on the uppermost side of the recess 310A when the opposite electrode 530 is formed, and thus, a portion of the recess 310A and the sealing portion 600 may be in contact with each other. In this case, the sealing portion 600 may contact the second functional layer 523 on a partition wall of the recess 310A through the portion 311A disposed on the uppermost side of the recess 310A, and thus, the second functional layer 523 may be firmly coupled to the sealing portion 600.

After the encapsulating substrate 700 is fixed by the sealing portion 600, as described above, a cleaning liquid may be sprayed into the through hole 710 by using a cleaning liquid supply portion CS. The cleaning liquid may be received in the second sealing portion 600B, which surrounds the through hole 710 around the through hole 710, to remove the first functional layer 521, the second dummy emission layer 522B, the second functional layer 523, and the opposite electrode 530, which are disposed on an area of the substrate 100 that is partitioned by the second sealing portion 600B.

The cleaning liquid as described above may be various. For example, the cleaning liquid may include ethyl acetate and/or dimethyl chloride, which are capable of removing both the intermediate layer 520 and the opposite electrode 530. Also, the cleaning liquid may include an acidic liquid including hydrofluoric acid (HF), hydrochloric acid (HCL), and/or nitric acid ($NO_3$), which are capable of removing the opposite electrode 530. The cleaning liquid may include an organic solvent including isopropyl alcohol, an aromatic, compound and/or an aliphatic compound, which are capable of removing the intermediate layer 520. The cleaning liquid is not limited to the above and may include any type of solvent capable of removing the opposite electrode 530 and/or the intermediate layer 520.

Then, the input sensing member 40 and then optical functional member 50 may be formed or, attached on the encapsulating substrate 700. According to an exemplary embodiment of the present disclosure, the optical functional member 50 and the input sensing member 40 may be formed or attached on the display panel 10.

In this case, after the encapsulating substrate 700 is fixed to the sealing portion 600, a separate opening might not be formed in the encapsulating substrate 700. For example, when the encapsulating substrate 700 is fixed to the sealing portion 600 and then the through hole 710 is formed in the encapsulating substrate 700, unlike the above description, the encapsulating substrate 700 may be damaged or the substrate 100 may be damaged. When the encapsulating substrate 700 without the through hole 710 is fixed to the sealing portion 600 and the through hole 710 is then formed by irradiating the encapsulating substrate 700 with a laser beam, the intermediate layer 520 or the light-emitting element 500, which is present near the through hole 710, may be damaged. In addition, when a mechanical method using a drill or the like is used to form the through hole 710 in the encapsulating substrate 700, a manufacturing time may increase.

However, when the through hole 710 is formed in the encapsulating substrate 700 and then fixed to the sealing portion 600 as described above, the problems as described above may be solved.

Figure 10:
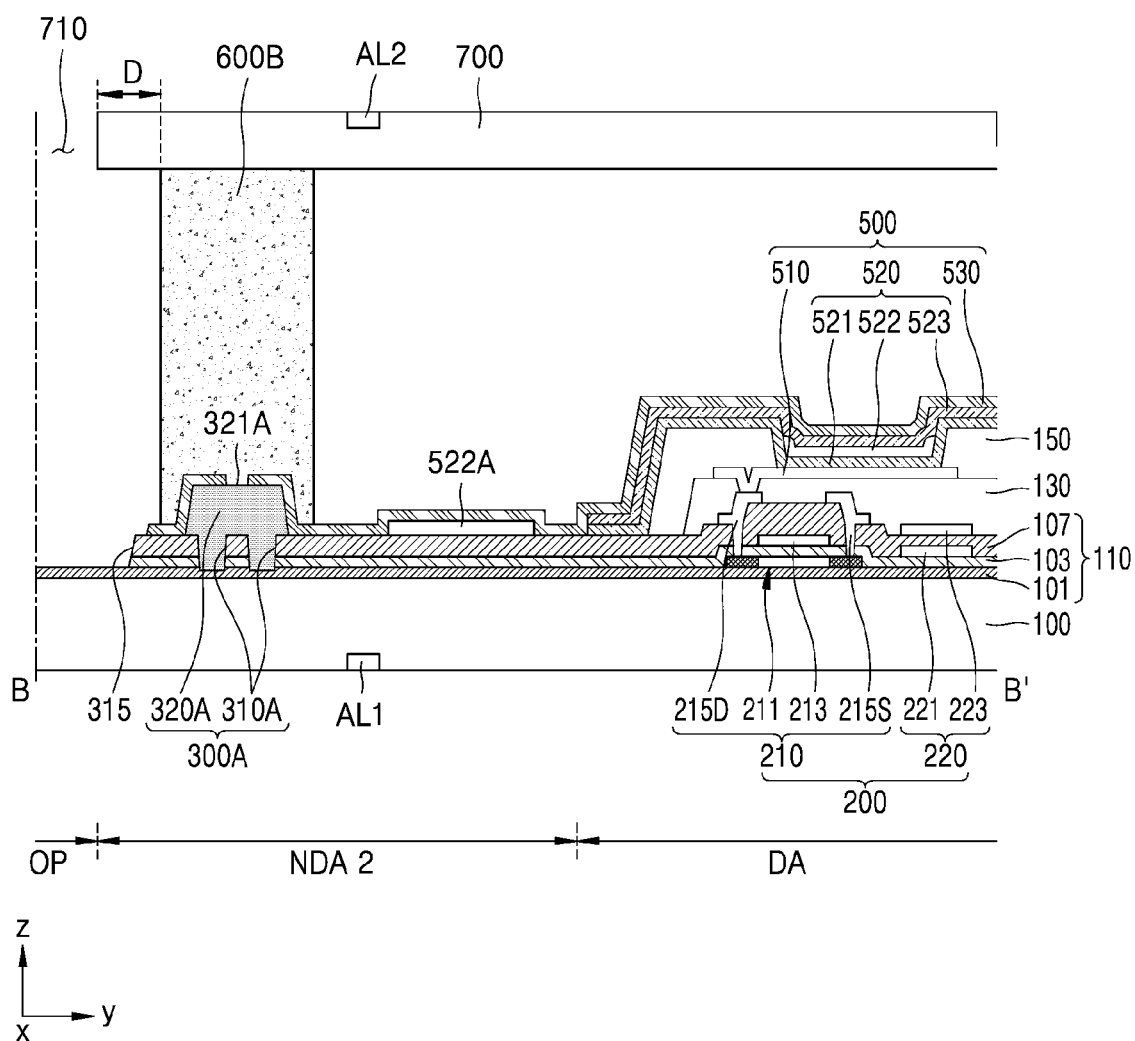
FIG. 10 is a cross-sectional view illustrating a display panel according to an exemplary embodiment of the present disclosure.

FIG. 10 is a cross-sectional view illustrating a display panel according to an exemplary embodiment of the present disclosure. In FIG. 10, the same reference numerals as those in FIG. 6 denote the same members as those in FIG. 6, and thus, detailed descriptions thereof will be omitted.

Referring to FIG. 10, the display panel 10 may further include a cladding layer 320A.

The cladding layer 320A at least partially overlaps a recess 310A to cover the recess 310A. The cladding layer 320A may be disposed directly on an insulating layer 110 having the recess 310A so as to directly contact the recess 310A, and a portion of the cladding layer 320A may be disposed in the recess 310A.

The cladding layer 320A may include an organic insulating material. For example, the cladding layer 320A may include the same material as the via insulating layer 130 and/or the pixel-defining layer 150 described above. In this case, the cladding layer 320A may provide a relatively flat top surface while covering the recess 310A. According to an exemplary embodiment of the present disclosure, the cladding layer 320A may include one or more of the intermediate layers 520 described above. For example, the, cladding layer 320A may include a first functional layer 521, an emission layer 522, and/or a second functional layer 523. In this case, the cladding layer 320A may be formed in a shape similar to the recess 310A along the outer surface of the recess 310A.

The cladding layer 320A reduces stress in a portion, in which the recess 310A is formed, of the insulating layer 110 which is an inorganic layer, and prevents a crack from propagating. The cladding layer 320A covers the recess 310A and thus may prevent particles generated during the manufacturing process from being stored in the recess 310A and moving to the light-emitting element 500 of the pixel P to cause a dark spot. In addition, the cladding layer 320A may block some of moisture or oxygen moving from the outside to the light-emitting element 500.

The first functional layer 521 and the second functional layer 523 may be formed exclusively in the display area DA. The emission layer 522 may be patterned such that patterns thereof are spaced apart from each other over the entire surface of the substrate 100. According to an exemplary embodiment of the present disclosure, the first functional layer 521 and the second functional layer 523 may be formed exclusively in the display area DA and the emission layer 522 may also be patterned exclusively in the display area DA. According to an exemplary embodiment of the present disclosure, the first functional layer 521, the emission layer 522, and the second functional layer 523 may be patterned exclusively in the display area DA or over the entire surface of the substrate 100. According to an exemplary embodiment of the present disclosure, the lust functional layer 521, the emission layer 522, and the second functional layer 523 may be formed in pattern forms on an area of the substrate 100 except for the first non-display area NDA1, or may be formed over the entire surface of the substrate 100 except for the first-non display area NDA1. Hereinafter, for convenience of description, the case where the first functional layer 521 and the second functional layer 523 are formed exclusively in the display area DA and the emission layer 522 is formed over the entire surface of the substrate 100 will be mainly described in detail.

The opposite electrode 530 may be disposed over the entire surface of a display substrate 100 except for the second non-display area NDA2 and the opening area OP. In this case, the opposite electrode 530 might not be deposited on a portion 321A of the upper surface of the cladding layer 320A or might not be deposited well on the portion 121A than on other portions, and thus, the portion 321A of the upper surface of the cladding layer 320A may be exposed to the outside and may contact the second sealing portion 600B.

Figure 11:
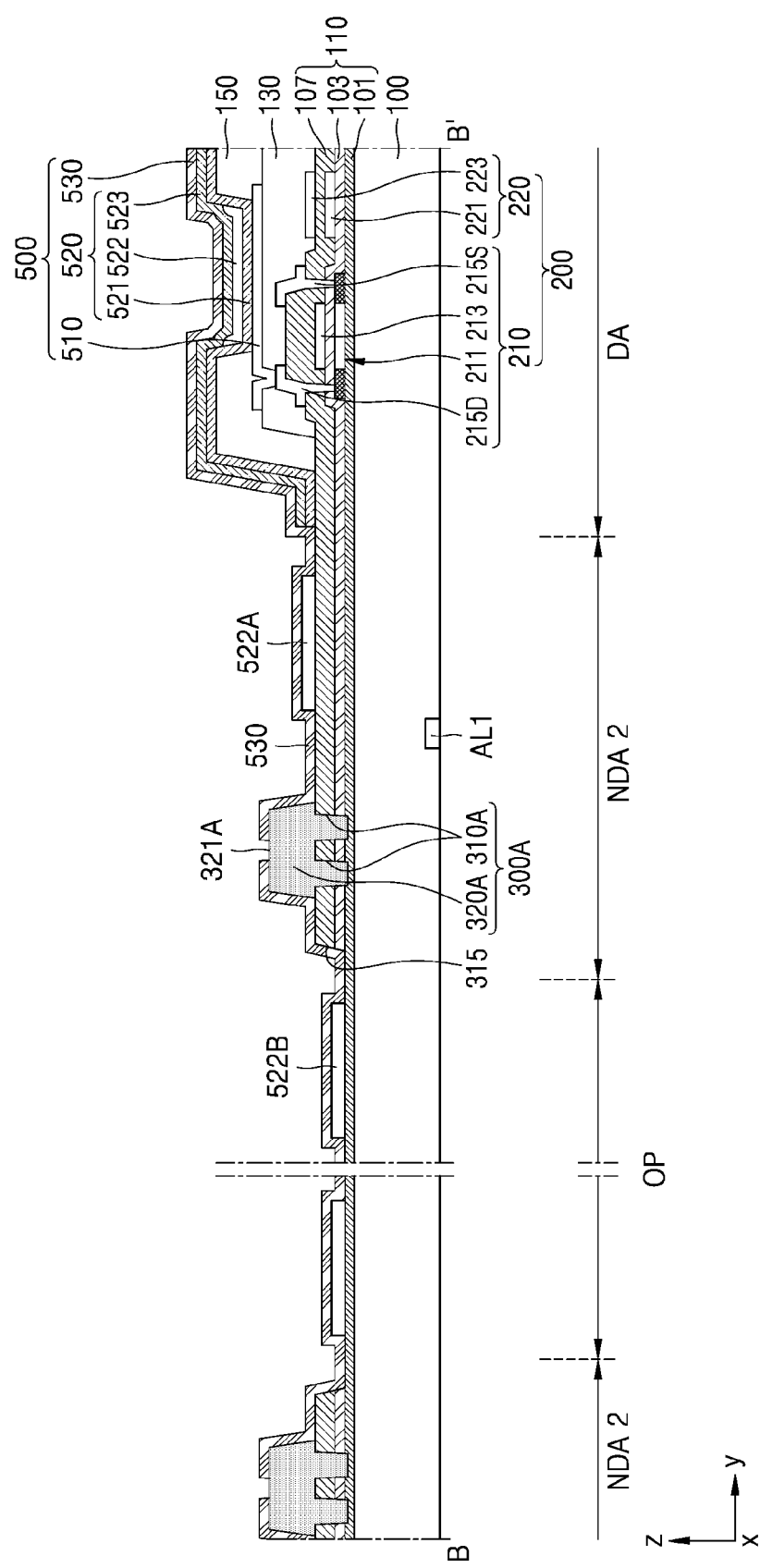
FIGS. 11 to 13 are cross-sectional views illustrating a method of manufacturing the display panel shown in FIG. 10.
Figure 12:
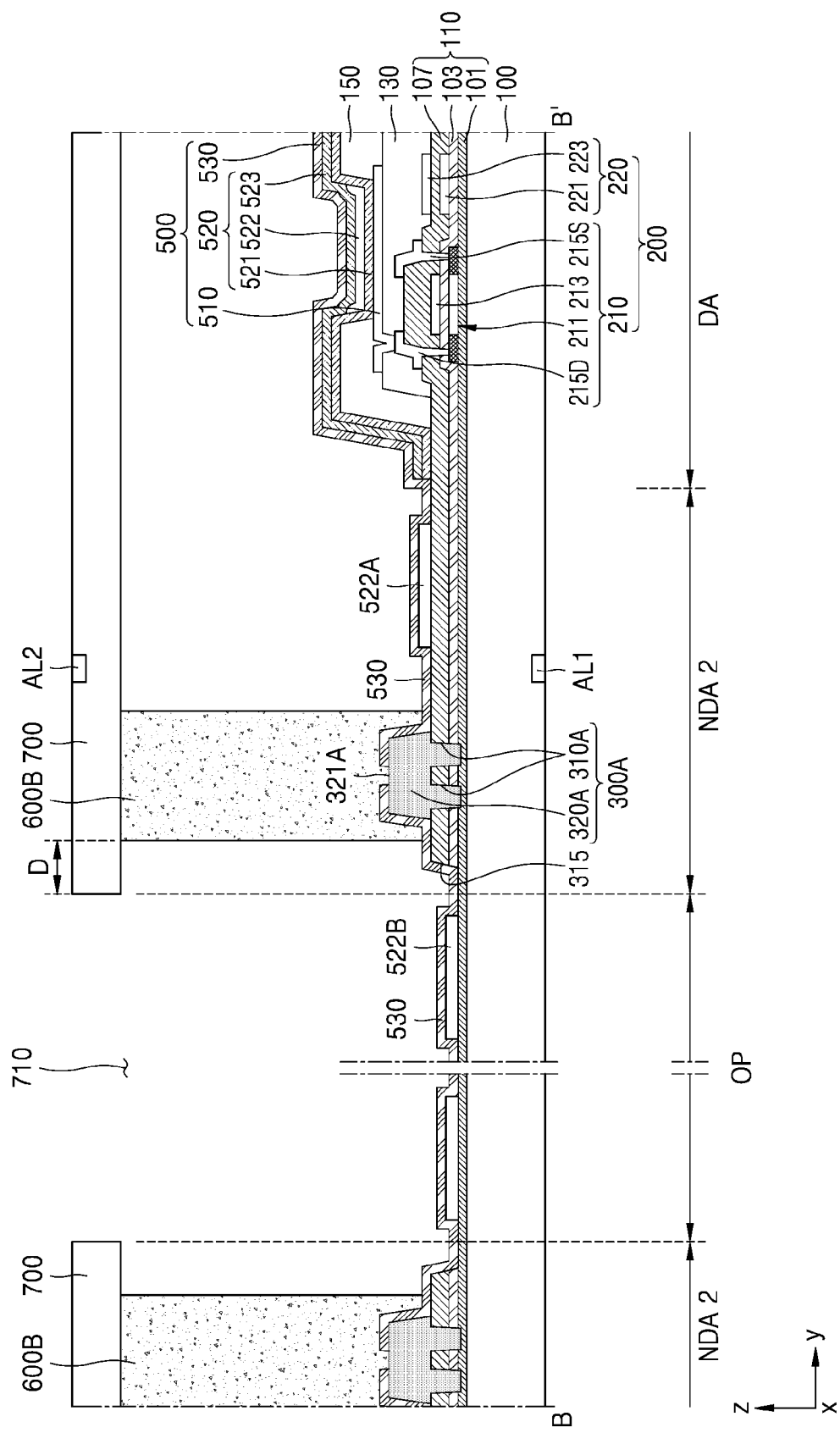
Figure 13:
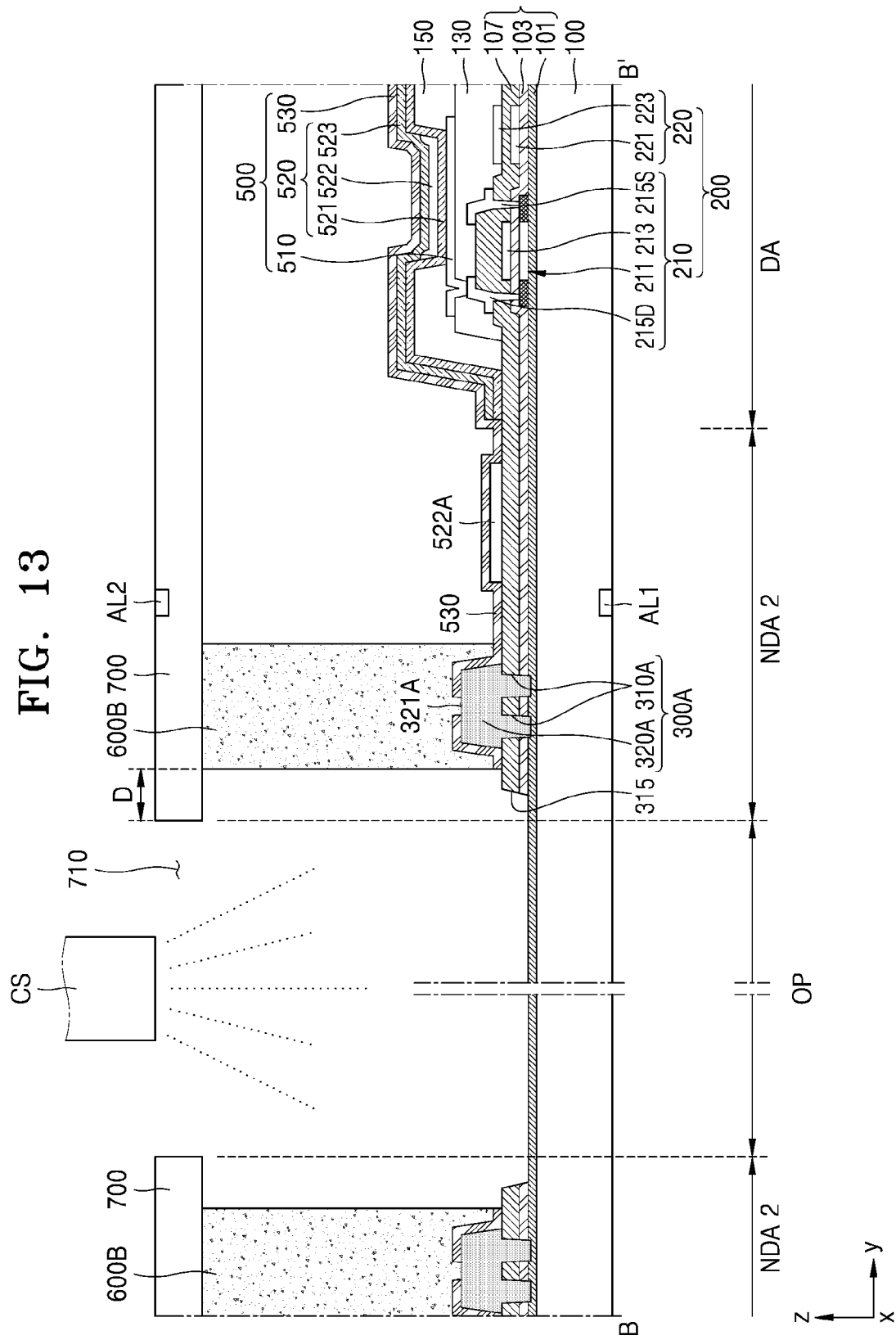

FIGS. 11 to 13 are cross-sectional views illustrating a method of manufacturing the display panel 10 shown in FIG. 10.

Referring to FIGS. 11 to 13, when the display panel 10 is manufactured, the pixel circuit 200 and the light-emitting element 500 may be formed. The recess 310A and the cladding layer 320A may be formed before the light-emitting element 500 is formed.

When the light-emitting element 500 is formed as described above, each of the first functional layer 521, the second functional layer 523, and the opposite electrode 530 may be formed over the entire surface of the substrate 100. Also, a plurality of emission layers 522 may be formed over the entire surface of the substrate 100 to be spaced apart from each other. According to an exemplary embodiment of the present disclosure, the first functional layer 521 and the second functional layer 523 may be formed exclusively in the display area DA and the opposite electrode 530 alone may be formed over the entire surface of the substrate 100. Also, a plurality of emission layers 522 may be formed over the entire surface of the substrate 100 to be spaced apart from each other. According to an exemplary embodiment of the present disclosure, the first functional layer 521, the emission layer 522, and the second functional layer 523 may be patterned exclusively in the display area DA or over the entire surface of the substrate 100. According to an exemplary embodiment of the present disclosure, the first functional layer 521, the emission layer 522, and the second functional layer 523 may be formed in pattern forms on an area of the substrate 100 except for the first non-display area NDA1, or may be formed over the entire surface of the substrate 100 except for the first non-display area NDA1. Hereinafter, for convenience of description, the case where only the opposite electrode 530 is formed over the entire surface of the substrate 100 and a plurality of emission layers 522 are formed spaced apart from each other over the entire surface of the substrate 100 will be mainly described in detail.

After the pixel circuit 200 and the light-emitting element 500 are formed, the sealing portion 600 may be formed on the recess 310A and the cladding layer 320A and then the encapsulating substrate 700 may be disposed. In this case, the encapsulating substrate 700 and the substrate 100 may be aligned with each other. The encapsulating substrate 700 and the substrate 100 may be aligned with each other to allow the through hole 710 of the encapsulating substrate 700 to be disposed within the second sealing portion 600B.

When alignment between the encapsulating substrate 700 and the substrate 100 is completed, the encapsulating substrate 700 and the substrate 100 may be fixed by curing the sealing portion 600. Then, a cleaning liquid may be supplied into the through hole 710 by a cleaning liquid supply portion CS. In this case, the cleaning liquid may remove the second dummy emission layer 522B and the opposite electrode 530 disposed in the opening area OP.

In addition, as shown in FIG. 2 or 3, the display device 1 may be manufactured by arranging various members on the display panel 10.

Accordingly, the display device 1 may securely fix the second sealing portion 600B and may also effectively block moisture or oxygen from penetrating between the second sealing portion 600B and the recess 310A. In addition, the display device 1 may maintain a strong coupling between the second sealing portion 600B and the cladding layer 320A as a portion of the cladding layer 320A, of which constituent is similar to that of the second sealing portion 600B, is exposed and contacts the second sealing portion 600B.

The method of manufacturing the display device might not include processing the through hole 710 after the manufacturing of the display panel 10 and thus may prevent breakage or damage of the display panel 10, which may occur during the processing of the through hole 710.

In addition, as the method of manufacturing the display device does not include processing the through hole 710 after the manufacturing of the display panel 10, the method may shorten the time required for processing the through hole 710.

Figure 14:
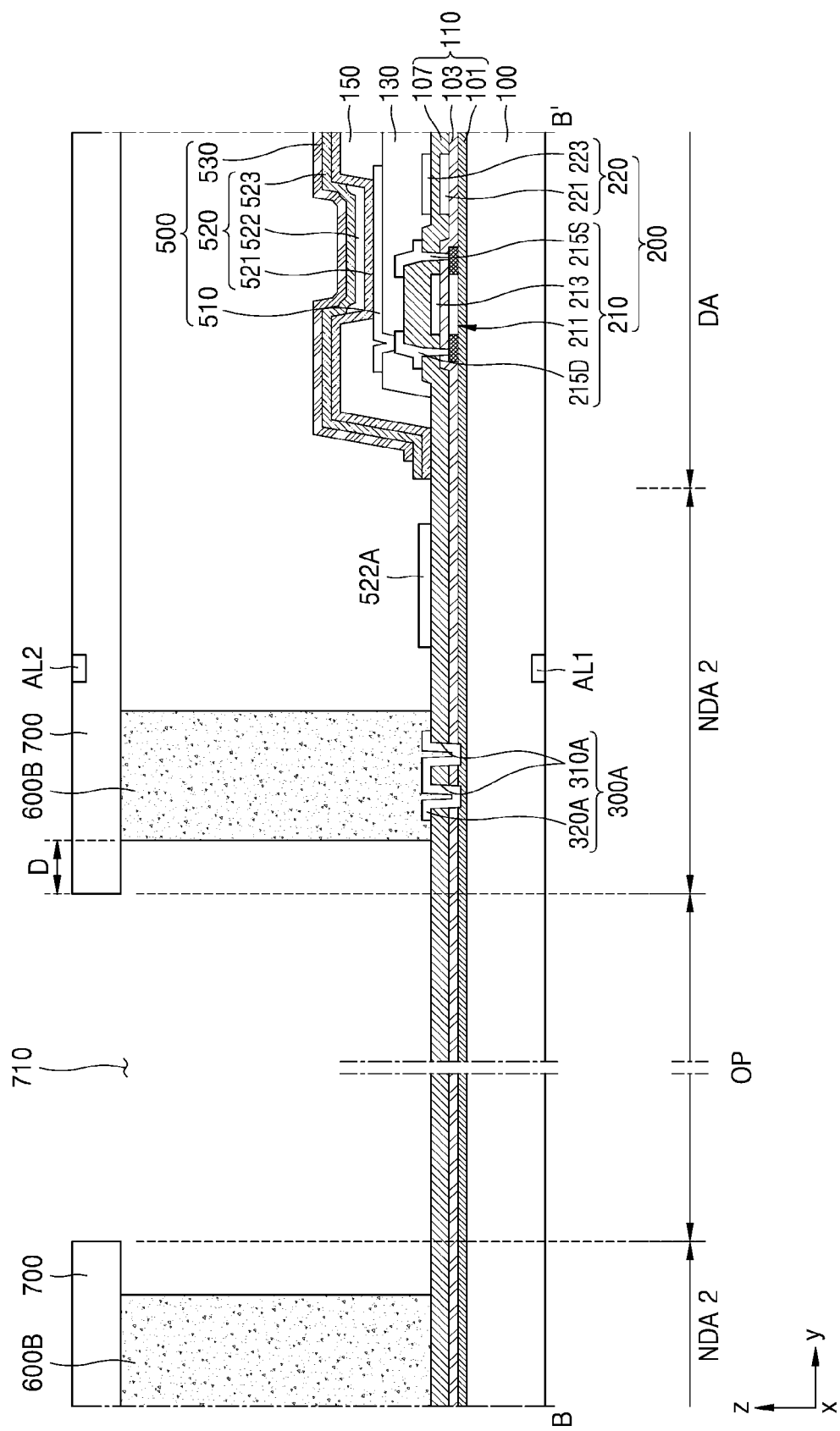
FIG. 14 is a cross-sectional view illustrating a display panel according to an exemplary embodiment of the present disclosure.

FIG. 14 is a cross-sectional view illustrating a display panel according to an exemplary embodiment of the present disclosure. In FIG. 14, the same reference numerals as those in FIG. 6 or 10 denote the same elements as those in FIG. 6 or 10, and thus, detailed descriptions thereof will be omitted.

Referring to FIG. 14, an opposite electrode 530 may be formed exclusively in a display area DA. In addition, a cladding layer 320A may be disposed on a recess 310A. In this case, the cladding layer 320A may be a first functional layer 521, an emission layer 522, and/or a second functional layer 523. Hereinafter, for convenience of description, the case where the cladding layer 320A is the emission layer 522 will be mainly described in detail.

When the emission layer 522 is formed, a portion of the emission layer 522 may be disposed in the recess 310A to form the cladding layer 320A. A sealing portion 600 may be disposed on the cladding layer 320A. In this case, both the cladding layer 320A and the sealing portion 600 include organic materials and thus may be firmly coupled to each other. The embodiment is not limited thereto and may have a structure in which the cladding layer 320A is not present.

Figure 15:
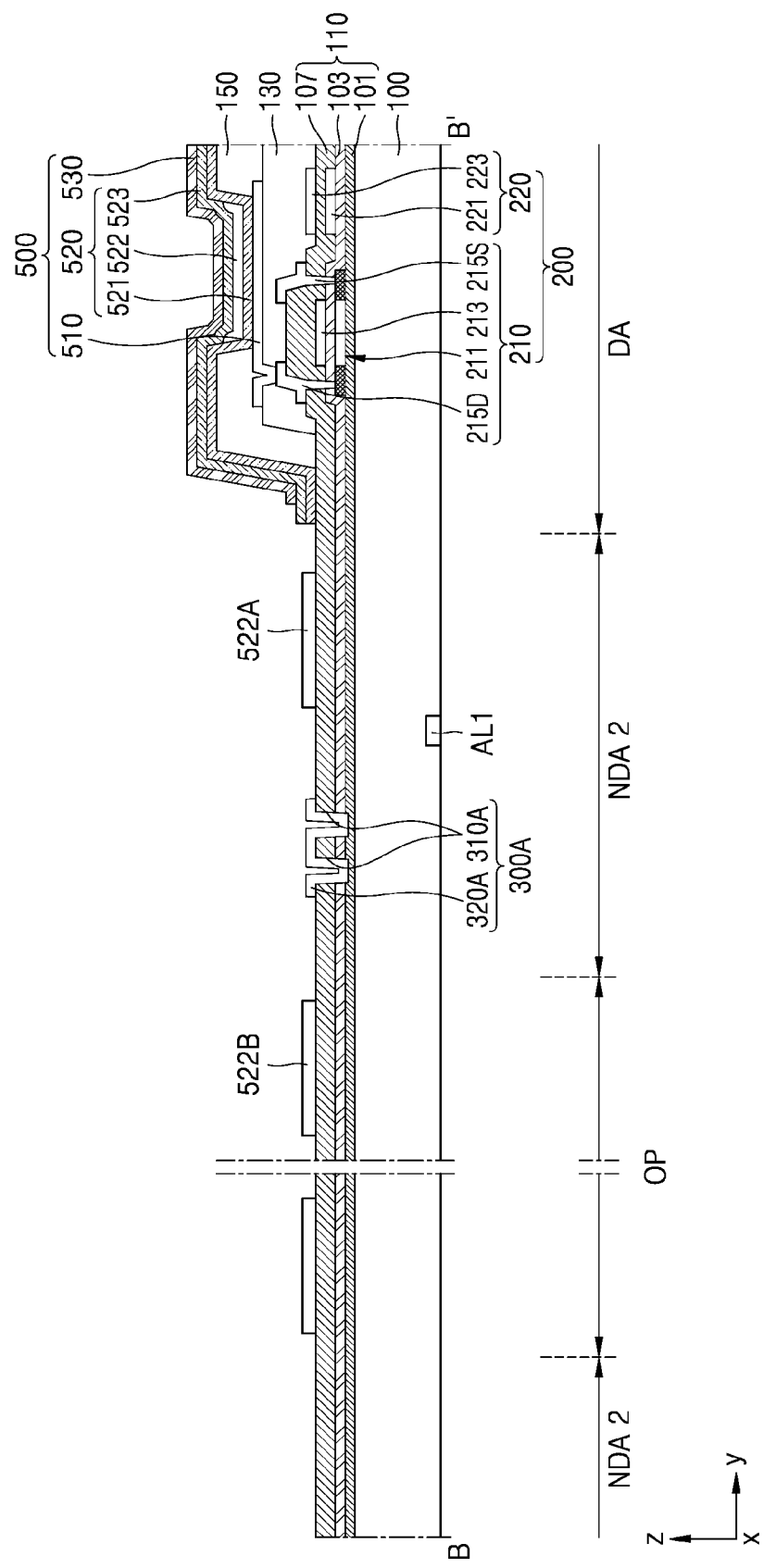
FIGS. 15 and 16 are cross-sectional views illustrating a method of manufacturing the display panel shown in FIG. 14.
Figure 16:
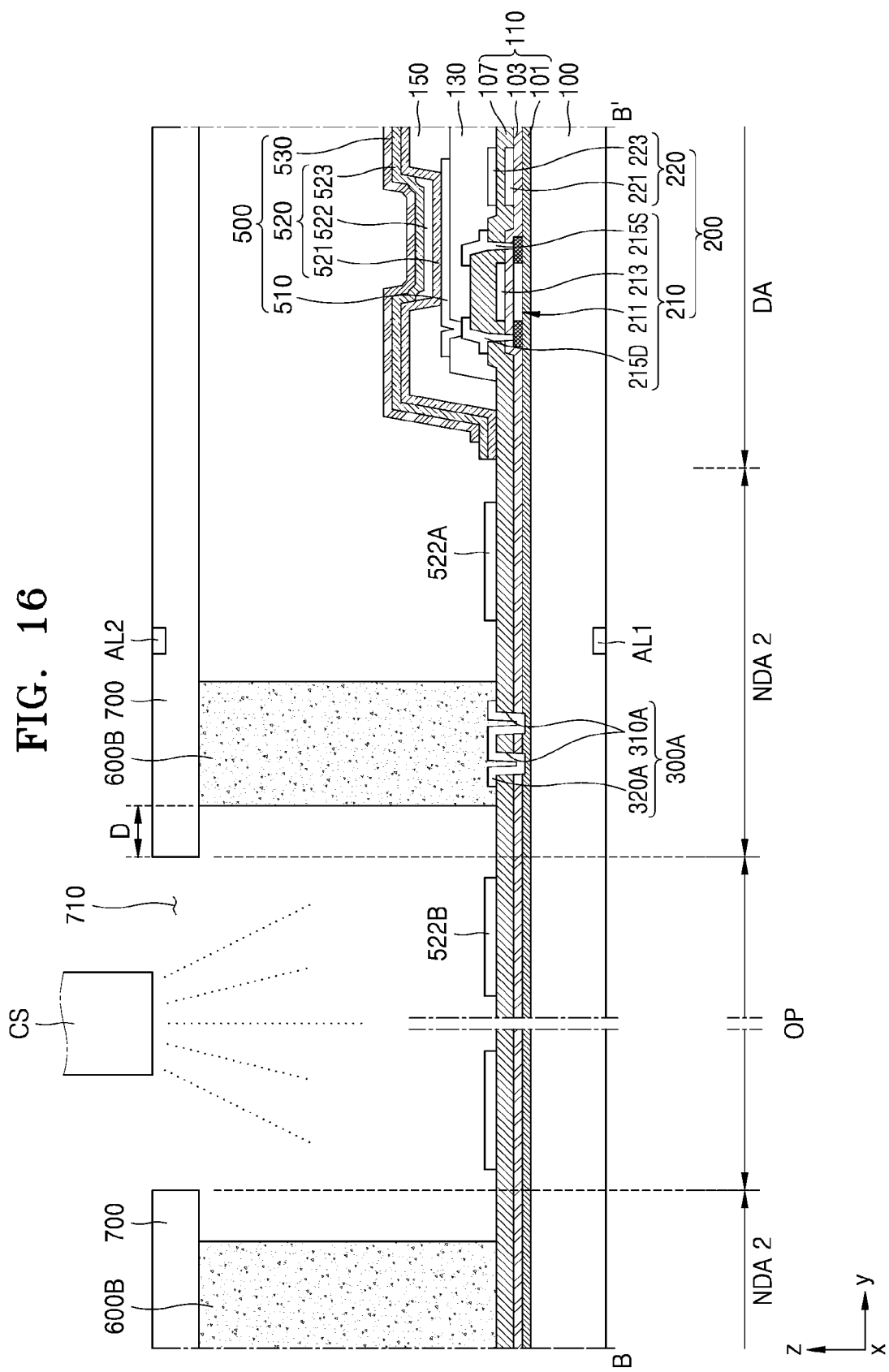

FIGS. 15 and 16 are cross-sectional views illustrating a method of manufacturing the display panel shown in FIG. 14.

Referring to FIGS. 15 and 16, the method of manufacturing the display panel is the same as or similar to that described above.

For example, a pixel circuit 200 and a light-emitting element 500 may be formed on a substrate 100. An opposite electrode 530 may be formed entirely over the substrate 100 except for an opening area OP. For example, the opposite electrode 530 may be formed in a first non-display area NDA1, a display area DA, and a second non-display area NDA2. In this case, a mask used in forming the opposite electrode 530 may block a deposition material from reaching the opening area OP. According to an exemplary embodiment of the present disclosure, the opposite electrode 530 may be fined in some of the first non-display area NDA1, the display area DA, and the second non-display area NDA2. According to an exemplary embodiment of the present disclosure, the opposite electrode 530 may be formed exclusively in the display area DA. For example, the mask used in forming the opposite electrode 530 may block a deposition material moving to the first non-display area NDA1, the opening area OP, and the second non-display area NDA2. In this case, the opposite electrode 530 might not be formed in the first non-display area NDA1, the opening area OP, and the second non-display area NDA2 but may be formed exclusively in the display area DA. Hereinafter, for convenience of description, the case where the opposite electrode 530 is formed exclusively in the display area DA will be mainly described in detail.

After the pixel circuit 200 and the light-emitting element s00 are formed, a sealing portion 600 may be disposed on a cladding layer 320A. In this case, an insulating layer 110 might not be removed from the opening area OP. Then, an encapsulating substrate 700 having a through hole 710 may be disposed to face the substrate 100, and the encapsulating substrate 700 and the substrate 100 may be coupled to each other through the sealing portion 600.

After the sealing portion 600 is cured, a cleaning liquid supply portion CS may spray a cleaning liquid through the through hole 710 of the encapsulating substrate 700. In this case, the cleaning liquid may enter the through hole 710 and be accommodated in a space formed by the substrate 100 and a second sealing portion 600B. For example, the cleaning liquid may remove a second dummy emission layer 522B disposed in the opening area OP.

When the above process is completed, the cleaning liquid may be removed and another member may be disposed on the display panel 10 and fixed to the display panel 10, as shown in FIG. 2 or 3. The manufacturing method is not limited to that described above and may be performed in the same manner even when the opposite electrode 530 and the second dummy emission layer 522B are disposed in the opening area OP, as described with reference to FIGS. 7 to 10.

Figure 17:
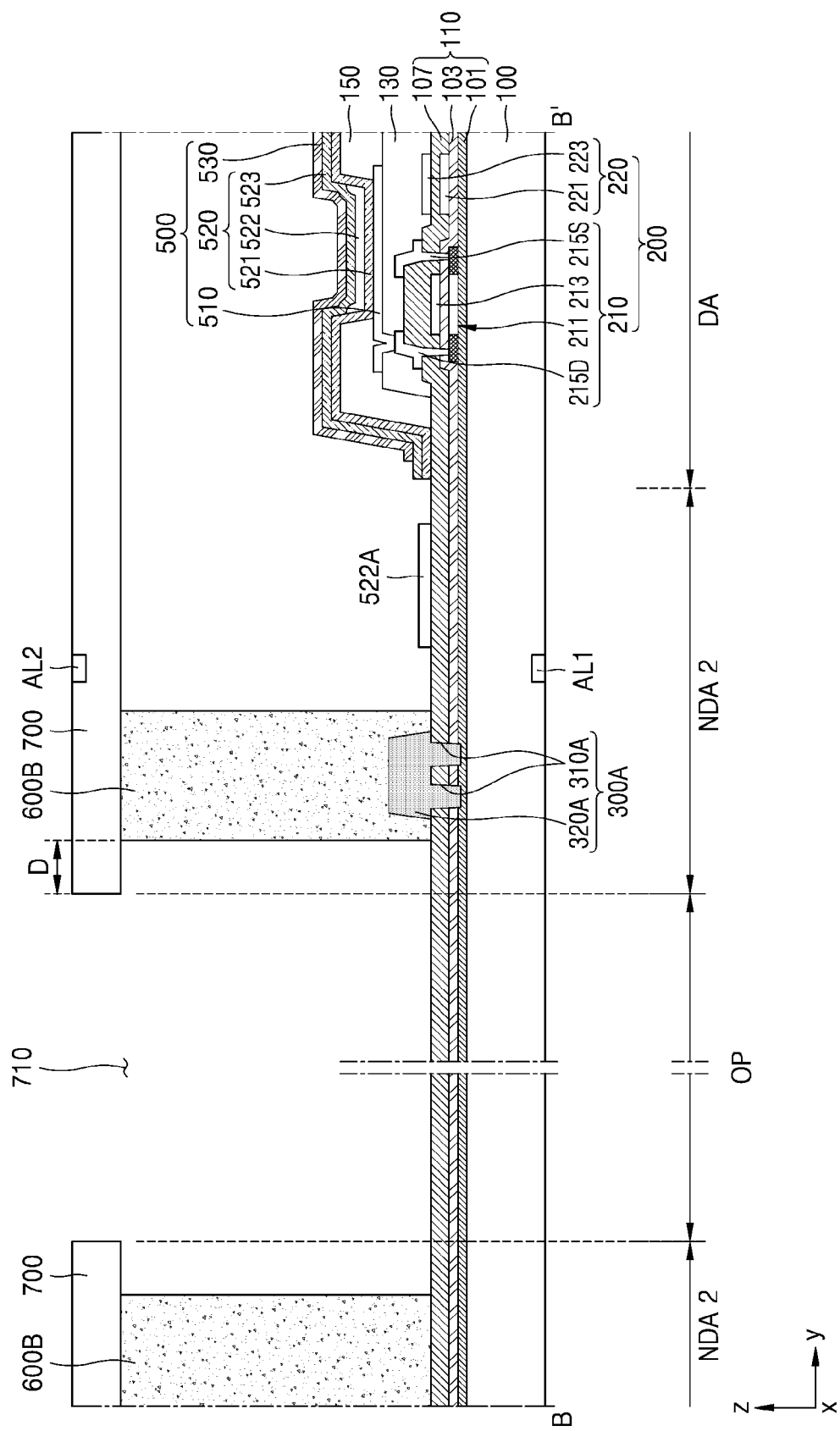
FIG. 17 is a cross-sectional view illustrating display panel according to an exemplary embodiment of the present disclosure.

FIG. 17 is a cross-sectional view illustrating a display panel according to an exemplary embodiment of the present disclosure. In FIG. 1,7, the same reference numerals as those in FIG. 14 denote the same elements as those in FIG. 14, and thus, detailed descriptions thereof will be omitted.

Referring to FIG. 17, an opposite electrode 530 may be disposed exclusively in a display area DA, as shown in FIG. 14. In this case, a cladding layer 320A may be disposed in a recess 310A. The cladding layer 320A may have the same shape as that described with reference to FIG. 10.

In this case, a sealing portion 600 may be firmly fixed due to the cladding layer 320A, and moisture or oxygen from the outside may be prevented from flowing into a light-emitting element 500.

Figure 18:
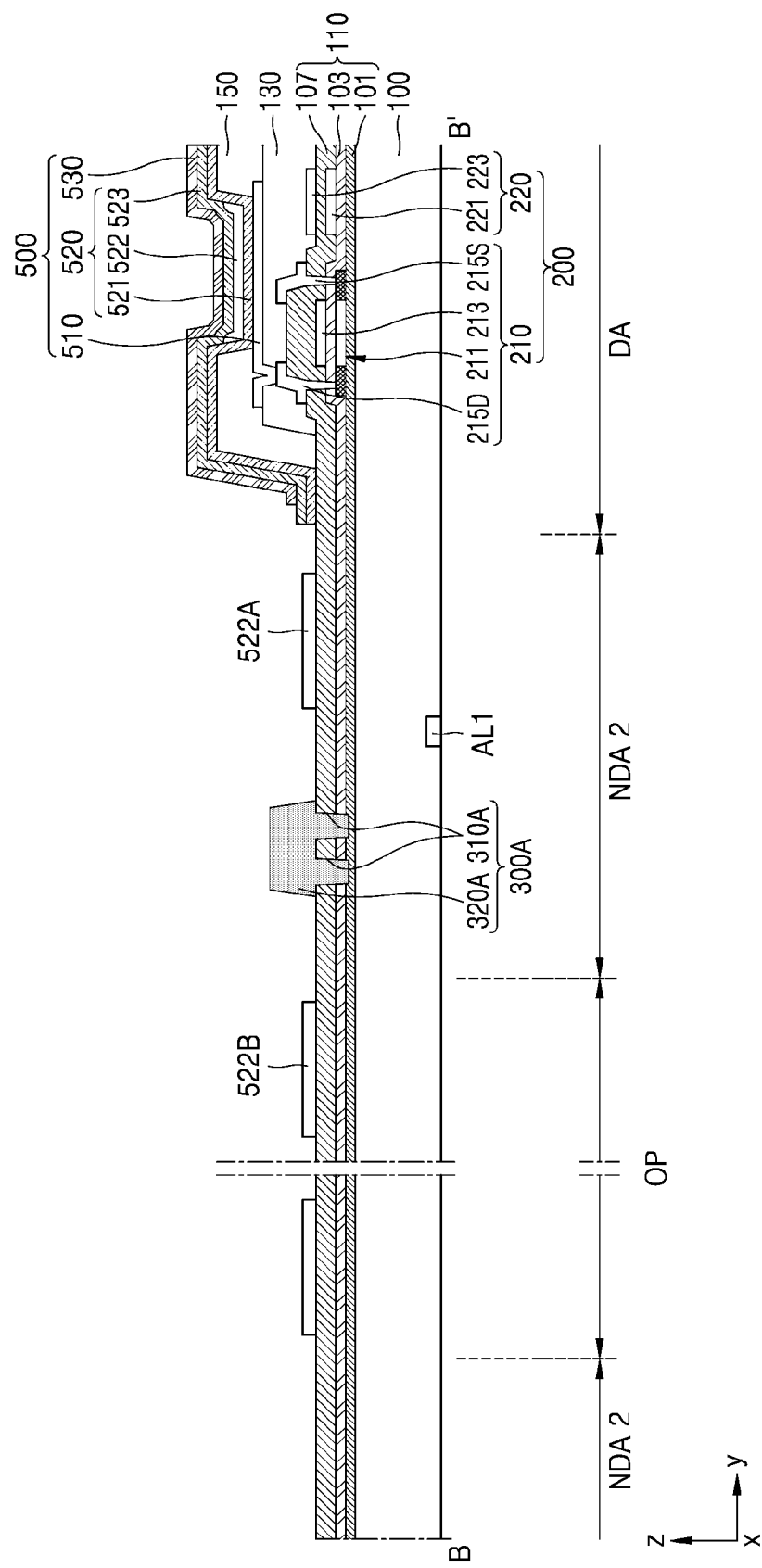
FIGS. 18 and 19 are cross-sectional views illustrating a method of manufacturing the display panel shown in FIG. 17.
Figure 19:
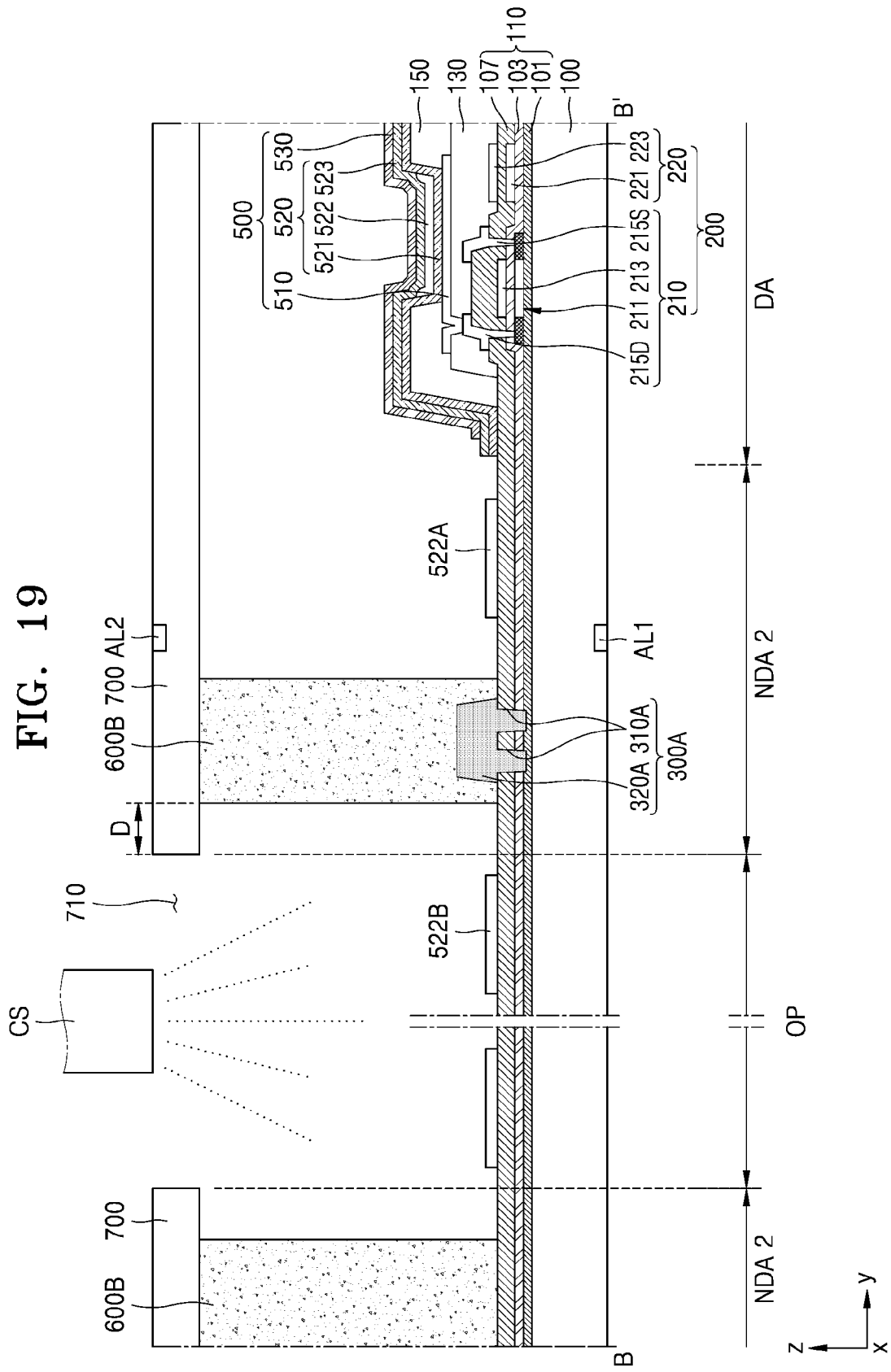

FIGS. 18 and 19 are cross-sectional views illustrating a method of manufacturing the display panel shown in FIG. 17.

Referring to FIGS. 18 and 19, the display panel 10 may be manufactured by a method that is the same as or similar to that described above.

For example, a pixel circuit 200 and a light-emitting element 500 may be formed on a substrate 100. In this case, an opposite electrode 530 may be formed exclusively in a display area DA and might not be formed in an opening area OP, a second non-display area NDA2, or a first non-display area.

An encapsulating substrate 700 may be fixed to a second sealing portion 600B by aligning the encapsulating substrate 700 with a substrate 100 after the second sealing portion 600B is disposed on a cladding layer 320A. In this case, the encapsulating substrate 700 and the substrate 100 may be fixed by a first sealing portion 600A as well as the second sealing portion 600B. Also, in this case, a through hole 710 may be formed in the encapsulating substrate 700.

After a sealing portion 600 is cured, a cleaning liquid supply portion CS may remove a second dummy emission layer 522B of the opening area OP by spraying a cleaning liquid through the through hole 710.

Then, the cleaning liquid may be removed, and another member may be disposed on the display panel 10 and fixed to the display panel 10, as shown in FIG. 2 or 3.

The manufacturing method is not limited to that described above and may be performed in the same manner even when the opposite electrode 530 and the second dummy emission layer 522B are disposed in the opening area OP, as described with reference to FIGS. 7 to 10.

Figure 20:
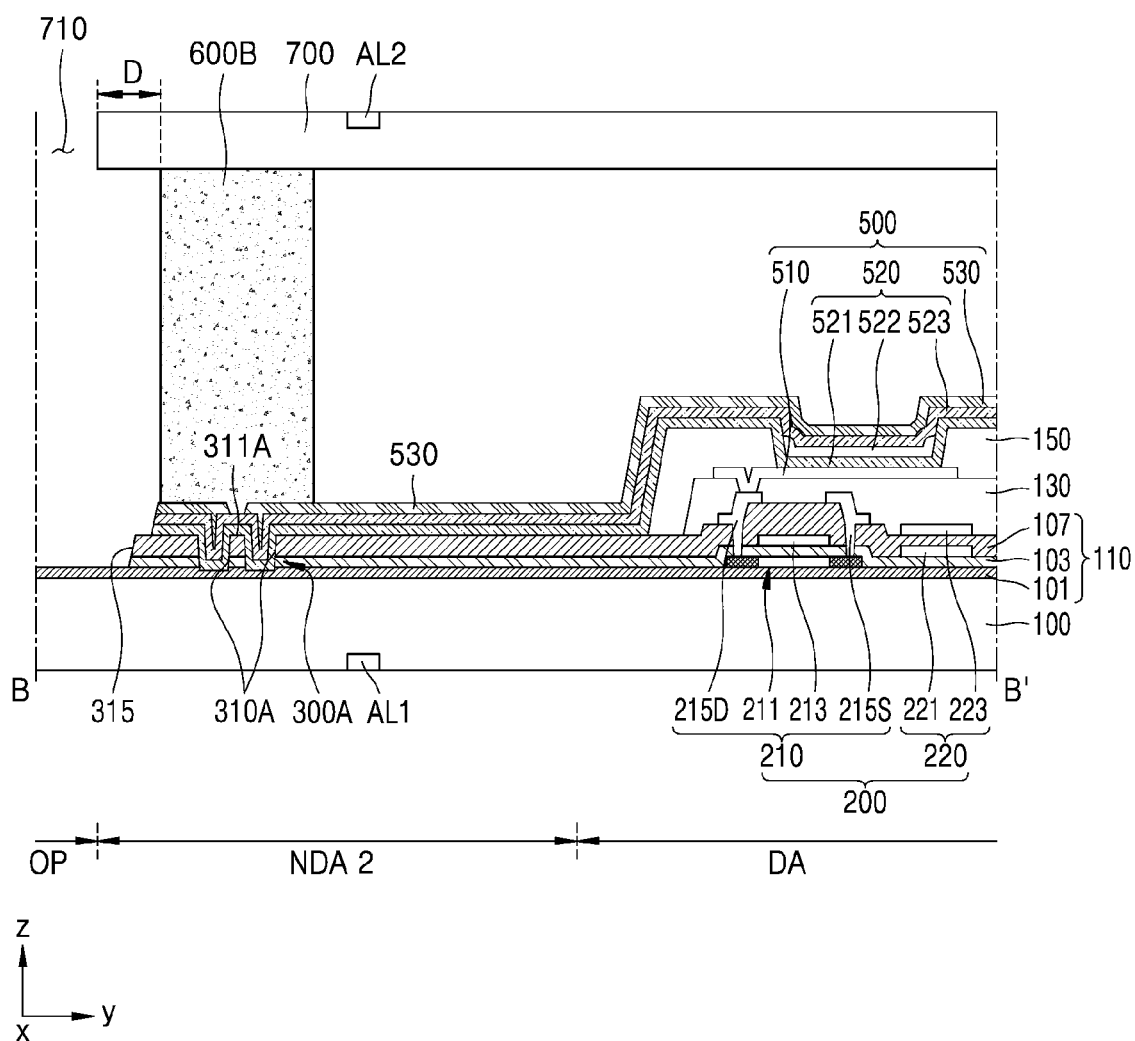
FIG. 20 is a cross-sectional view illustrating a display panel according to an exemplary embodiment of the present disclosure.

FIG. 20 is a cross-sectional view illustrating a display panel according to an exemplary embodiment of the present disclosure.

Referring to FIG. 20, in the display panel 10, only a first functional layer 521 and a second functional layer 523 of an intermediate layer 520 may be disposed over the entire surface of a substrate 100. In this case, an emission layer 522 may be patterned exclusively at an opening of a pixel-defining layer 150. For example, a plurality of emission layers 522 may be spaced apart from each other exclusively in a display area DA.

The display panel 10 may be manufactured similar to that shown in FIGS. 7 to 9. For example, a pixel circuit 200 and a light-emitting element 500 may be formed on the substrate 100. In this case, a first functional layer 521, a second functional layer 523, and an opposite electrode 530 may be disposed over the entire surface of the substrate 100.

Then, a sealing portion is disposed on a pattern portion 300A, and then an encapsulating substrate 700 having a through hole 710 is placed and fixed.

After the above process is completed, a cleaning liquid may be sprayed through the through hole 710 to remove the opposite electrode 530, the second functional layer 523, and the first functional layer 521 disposed in the opening area OP.

The display panel 10 is not limited to the above, and in an embodiment, only the opposite electrode 530 of the opening area OP may be removed.

The display panel 10 shown in FIG. 20 is not limited to the above and may selectively include the structure described above.

Figure 21:
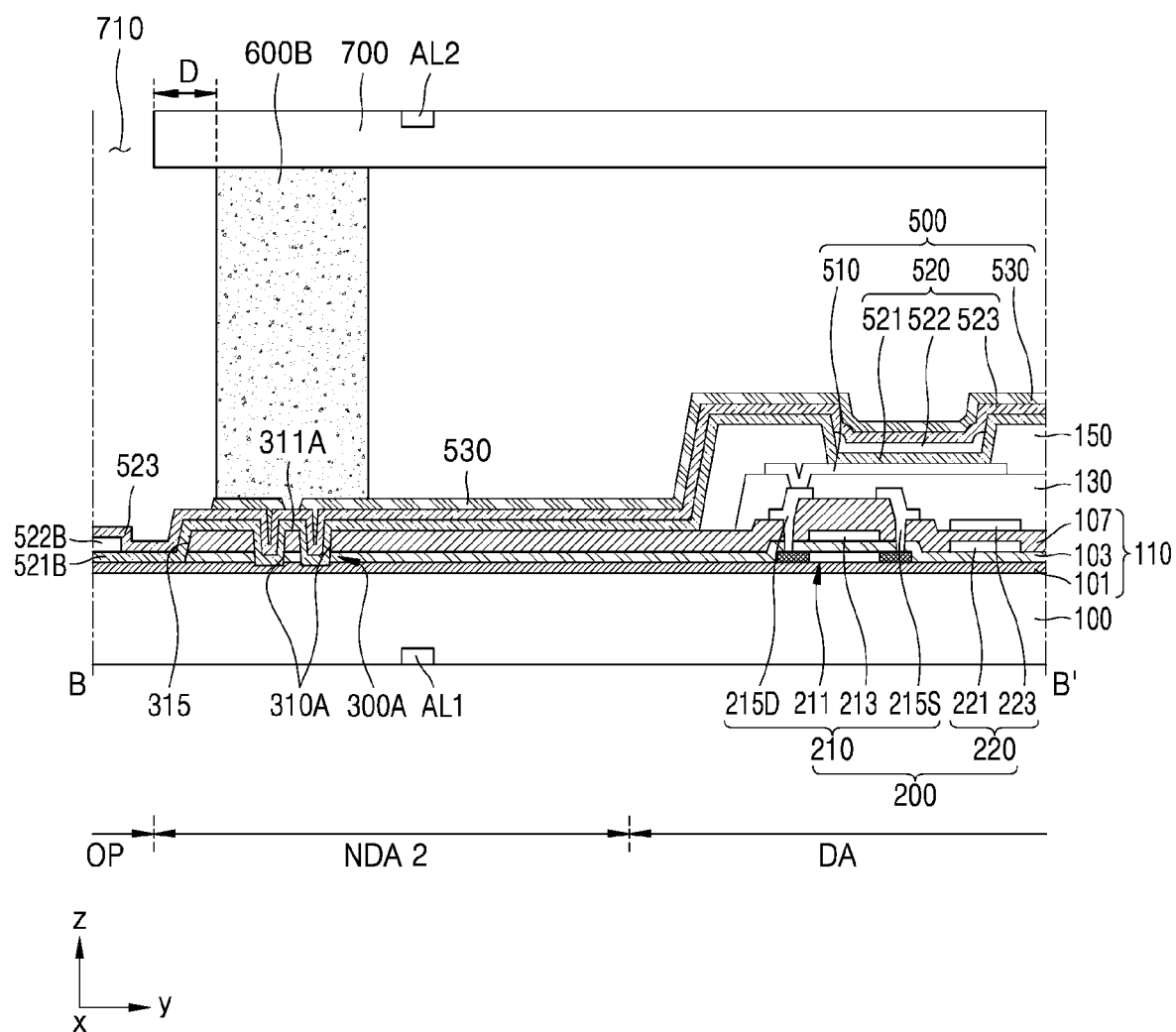
FIG. 21 is a cross-sectional view illustrating a display panel according to an exemplary embodiment of the present disclosure.

FIG. 21 is a cross-sectional view illustrating, a display panel according to an exemplary embodiment of the present disclosure.

Referring to FIG. 21, in the display panel 10, a first functional layer 521, an emission layer 522, and/or a second functional layer 523 of an intermediate layer 520 may be disposed over the entire surface of a substrate 100. In this case, an opposite electrode 530 might not be disposed in an opening area OP. Hereinafter, for convenience of description, the case where the first functional layer 521, the emission layer 522, and the second functional layer 523 are disposed over the entire surface of the substrate 100 and the opposite electrode 530 is disposed over the substrate in an area other than the opening area OP will be mainly described in detail.

In the display panel 10 as described above, a first sealing portion and a second sealing portion 600B may be disposed after a pixel circuit 200 and a light-emitting element 500 is formed on a substrate 100, and an encapsulating substrate 700 having a through hole 710 may be fixed to the first sealing portion and the second sealing portion 600B.

Then, as shown in FIG. 9, the opposite electrode 530 of the opening area OP may be selectively removed by spraying a cleaning liquid through the through hole 710. In this case, the cleaning liquid may be the same as or similar to those described above. According to an exemplary embodiment of the present disclosure, the cleaning liquid may include an acidic liquid including HF, HCL, and/or $NO_3$. In this case, the opposite electrode 530 may be selectively removed and thus at least a portion of the intermediate layer 520 may remain in the opening area OP.

When the opposite electrode 530 is removed through the cleaning liquid, the first functional layer 521, the emission layer 522, and/or the second functional layer 523 may remain in the opening area OR. In this case, the intermediate layer 520 remaining in the opening area OP might not block light incident on a component or light emitted from the component when the component operates.

The display panel 10 is not limited to the above, and a second dummy emission layer 522B might not be disposed in the opening area OP. According to an exemplary embodiment of the present disclosure, the intermediate layer 520 of the opening area OP may be completely removed.

The display panel 10 shown in FIG. 21 is not limited to the above and may include selectively include the structure described above.

Figure 22:
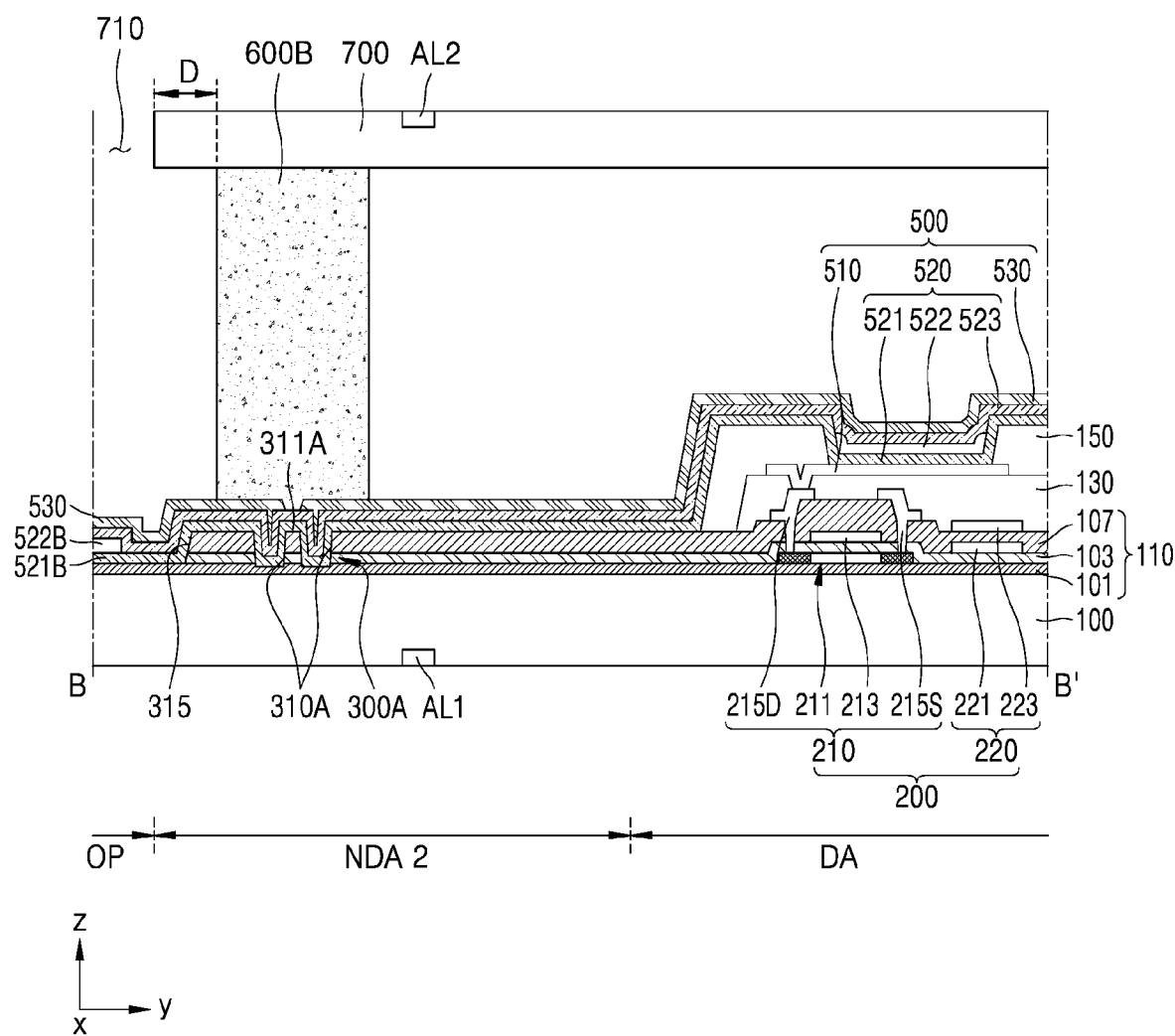
FIG. 22 is a cross-sectional view illustrating a display panel according to exemplary embodiment of the present disclosure.

FIG. 22 is a cross-sectional view illustrating a display panel according to an exemplary embodiment of the present disclosure.

Referring to FIG. 22, one or more of the layers in an intermediate layer 520 and an opposite electrode 530 may be disposed in an opening area OP of the display panel 10. Hereinafter, for convenience of description, the case where a first functional layer 521, a second dummy emission layer 522B, a second functional layer 523, and the opposite electrode 530 are disposed in the opening area OP will be mainly described in detail.

In the display panel 10, a sealing portion may be disposed after a pixel circuit 200 and a light-emitting element 500 are formed on a substrate 100, and then an encapsulating substrate 700 having a through hole 710 formed therein may be fixed to the sealing portion. In this case, the through hole 710 may be formed when the encapsulating substrate 700 is manufactured, as described above, or may be formed before the encapsulating substrate 700 is attached to the sealing portion after the encapsulating substrate 700 is manufactured.

After the encapsulating substrate 700 is fixed to the sealing portion, as described above, a cleaning liquid might not be sprayed through the through hole 10.

The display panel 10 shown in FIG. 22 is not limited to the above and may selectively include the structure described above.

Figure 23:
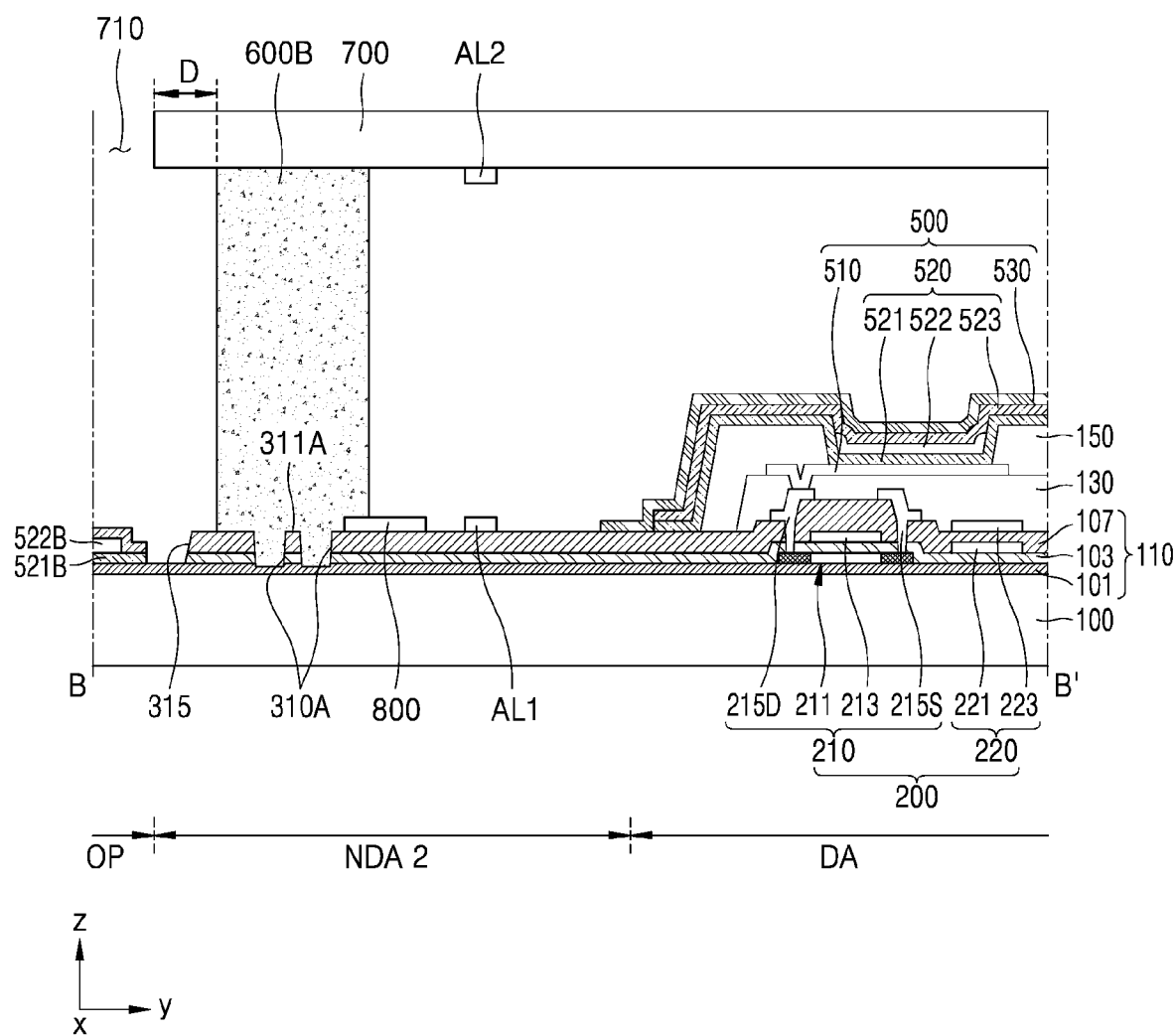
FIG. 23 is a cross-sectional view illustrating a display panel according to an exemplary embodiment of the present disclosure.

FIG. 23 is a cross-sectional view illustrating a display panel according to an exemplary embodiment of the present disclosure.

Referring to FIG. 23, the display panel 10 may include an intermediate layer 520 patterned over a substrate 100, the intermediate layer 520 including a plurality of layers that are spaced apart from each other. In this case, as an embodiment, the intermediate layer 520 may be patterned over the entire surface of the substrate 100. According to an exemplary embodiment of the present disclosure, the intermediate layer 520 may be patterned exclusively in a display area DA. According to an exemplary embodiment of the present disclosure, the intermediate layer 520 may be patterned over an area of the substrate 100 except for a first non-display area. According to an exemplary embodiment of the present disclosure, the intermediate layer 520 may be patterned in an opening area OP and the display area DA. Hereinafter, for convenience of description, the case where the intermediate layer 520 is patterned over the entire surface of the substrate 100 will be mainly described in detail.

The display panel 10 may include a dummy wiring 800. The dummy wiring 800 may be disposed in the first non-display area and a second non-display area NDA2 and may be disposed between an insulating layer 110 and a sealing portion. In this case, the dummy wiring 800 disposed in the second non-display area NDA2 may be disposed between a second sealing portion 300B and a pixel circuit 200. According to an exemplary embodiment of the present disclosure, although not shown in the drawings, the dummy wiring 800 may be disposed between the second sealing portion 300B and the opening area OP. In this case, the dummy wiring 800 may be arranged such that at least a portion of the dummy wiring 800 overlaps the second sealing portion 300B. The dummy wiring 800 may be configured to apply energy to the second sealing portion 300B when external power is applied to the dummy wiring 800, to thereby melt the second sealing portion 300B or to make the second sealing portion 300B attachable to an encapsulating substrate 700. A dummy wiring disposed in the first non-display area may be the same as or similar to the dummy wiring 800 disposed in the second non-display area NDA2.

A first alignment mark AL1 may protrude from the substrate 100 toward the encapsulating substrate 700. In this case, the first alignment mark AL1 may be formed of the same material as a source electrode 215S and/or a drain electrode 215D when the source electrode 215S and/or a drain electrode 215D is formed.

A second alignment mark AL2 may protrude from the encapsulating substrate 700 toward the substrate 100. In this case, the second alignment mark AL2 may be formed by patterning a metal or the like. According to an exemplary embodiment of the present disclosure, the second alignment marks AL2 may include various materials such as ink, film, and the like.

The display panel 10 may be manufactured similar to that described above. As an embodiment, the encapsulating substrate 700 may be fixed to a sealing portion alter the intermediate layer 520 and an opposite electrode 530 are formed as shown in FIGS. 6 to 9, and then the intermediate layer 520 and the opposite electrode 530 of the opening area OP may be removed by spraying a cleaning liquid through the through hole 710.

The display panel 10 shown in FIG. 23 is not limited to the above and may selectively include the structure described above.

Figure 24:
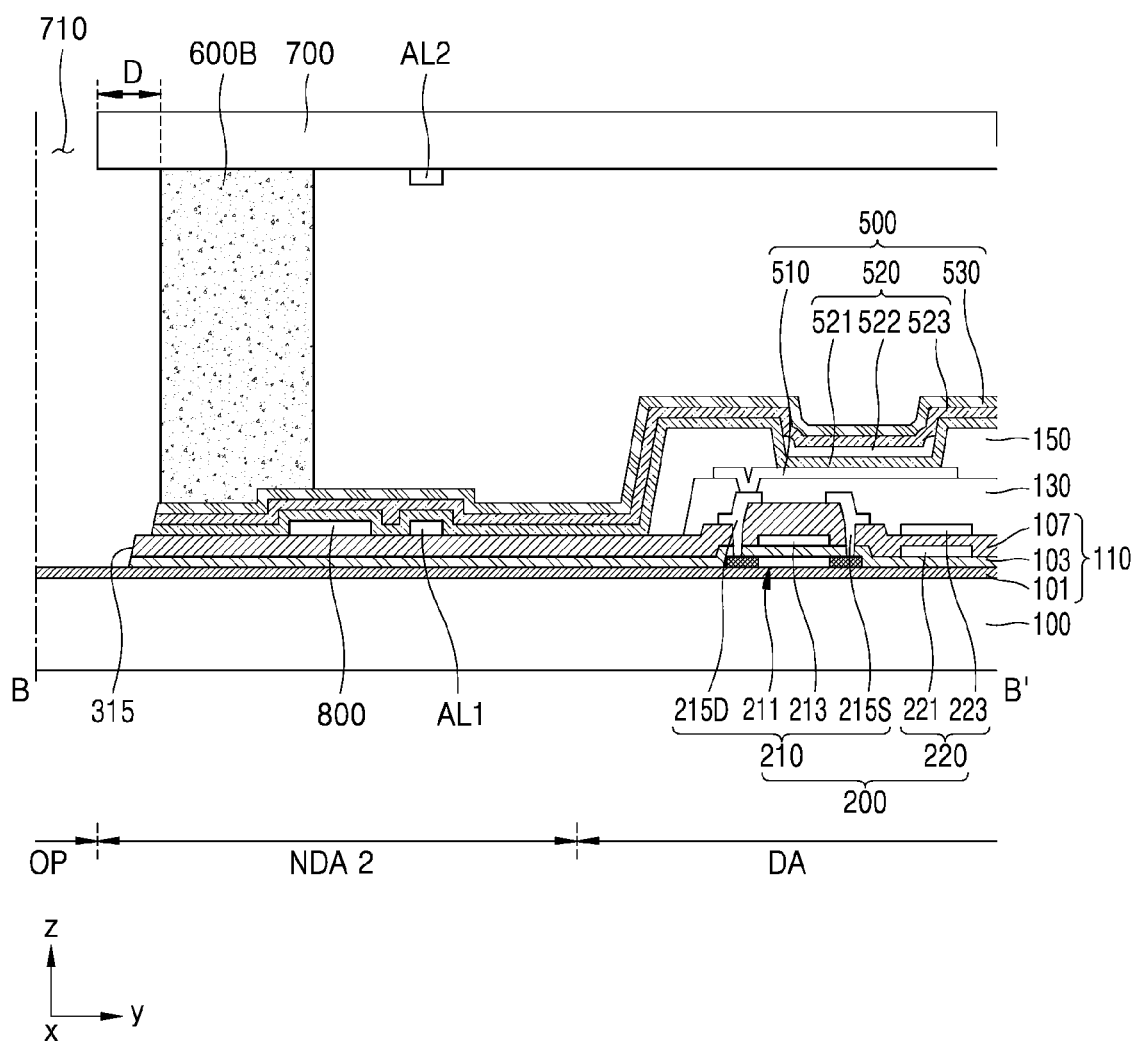
FIG. 24 is a cross-sectional view illustrating a display panel according to an exemplary embodiment of the present disclosure.

FIG. 24 is a cross-sectional view illustrating a display panel according to an exemplary embodiment of the present disclosure.

Referring to FIG. 24, the display panel 10 may include a substrate 100, a pixel circuit 200, a light-emitting element 500, an encapsulating substrate 700 having a through hole 710 formed therein, a sealing portion, and a dummy wiring 800. The substrate 100, the pixel circuit 200, the light-emitting element 500, the encapsulating substrate 700 having the through hole 710 formed therein, the sealing portion, and the dummy wiring 800 are the same as or similar to those described above, and thus, detailed descriptions thereof will be omitted.

In the display panel 10, the pixel circuit 200 and the light-emitting element 500 may be formed on the substrate 100. In this case, a first functional layer 521, a second functional layer 523, and an opposite electrode 530 may be disposed in each of a display area DA, a second non-display area NDA2, and an opening area OP.

Then, the encapsulating substrate 700 having the through hole 710 may be disposed in a second sealing portion 300B after the second sealing portion 300B is disposed on the opposite electrode 530. Then, the encapsulating substrate 700 may be fixed to the second sealing portion 300B by applying energy to the second sealing portion 300B through the dummy wiring 800. In this case, energy may be applied to the second sealing portion 300B from the dummy wiring 800 or may be applied to the second sealing portion 300B through ultraviolet (UV) rays or the like.

Then, the first functional layer 521, the second functional layer 523, and the opposite electrode 530 disposed in the opening area OP may be removed by spraying a cleaning liquid through the through hole 710.

The display device according to embodiments may prevent an area around an opening of an encapsulating substrate from being broken when a display panel including an opening area is manufactured.

In the display device according to embodiments, defects might not occur as the encapsulating substrate is not broken, and moisture and oxygen flowing into a display layer may be effectively blocked.

The method of manufacturing a display device, according to embodiments, may shorten the time required for manufacturing a display panel including an opening area.

The method of manufacturing a display device, according to embodiments, may reduce defects in manufacturing the display device.

It should be understood that the exemplary embodiments of the present disclosure described herein should be considered in a descriptive sense and that various changes may be made to these described embodiments without departing from the inventive concepts described herein. The descriptions of features or aspects within each embodiment should typically be considered as available for other similar features or aspects in other embodiments and so the disclosed features and aspects may be mixed and matched to form new movements. While one or more embodiments have been described with reference to the figures, it will be understood by those of ordinary skill in the art that various changes in form and details may be made therein without departing from the spirit and scope of the present disclosure.

What is claimed is:

1. A display device, comprising:
   a substrate including a display area, an opening area disposed in the display area, a first non-display area at least partially surrounding the display area, and a second non-display area at least partially surrounding the opening area, the substrate being continuous across the opening area;
   a display layer disposed in the display area;
   an encapsulating: substrate at least partially covering the display layer and having an opening corresponding to the opening area;
   a sealing portion disposed between the encapsulating substrate and the substrate, the sealing portion being disposed in the. second non-display area and connecting the encapsulating substrate to the substrate;

a partition wall disposed between the substrate and the sealing portion;

a cover member disposed on an opposite side of the substrate from the display layer, the cover member having an opening corresponding to the opening area; and a component disposed within the opening of the cover member.

2. The display device of claim 1, wherein the sealing portion is in direct contact with the partition wall.

3. The display device of claim 1, wherein the partition wall comprises an in organic layer and/or an organic layer.

4. The display device of claim 3, wherein the sealing portion is in contact with the organic layer of the partition wall.

5. The display device of claim 1, wherein al inner surface of the opening of the encapsulating substrate protrudes from the inside of the sealing portion towards the center of the opening.

6. The display device of claim 1, wherein the substrate and the encapsulating substrate each comprise an alignment mark disposed at corresponding positions.

* * * * *

UNITED STATES PATENT AND TRADEMARK OFFICE
CERTIFICATE OF CORRECTION

Page 1 of 1

PATENT NO. : 11,690,244 B2
APPLICATION NO. : 16/856716
DATED : June 27, 2023
INVENTOR(S) : Seungchan Lee et al.

It is certified that error appears in the above-identified patent and that said Letters Patent is hereby corrected as shown below:

On the Title Page

Item [72], first named inventor change:
[Seungchang Lee]
To:
Seungchan Lee

Signed and Sealed this
First Day of April, 2025

Coke Morgan Stewart
*Acting Director of the United States Patent and Trademark Office*